US012777683B2

(12) United States Patent
Xu et al.

(10) Patent No.: US 12,777,683 B2
(45) Date of Patent: Oct. 27, 2026

(54) SEMICONDUCTOR DEVICE

(71) Applicant: Samsung Electronics Co., Ltd., Suwon-si (KR)

(72) Inventors: Yang Xu, Suwon-si (KR); Gyeom Kim, Suwon-si (KR); Pankwi Park, Suwon-si (KR); Ryong Ha, Suwon-si (KR); Yoon Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 323 days.

(21) Appl. No.: 18/588,322

(22) Filed: Feb. 27, 2024

(65) Prior Publication Data

US 2025/0040188 A1 Jan. 30, 2025

(30) Foreign Application Priority Data

Jul. 27, 2023 (KR) ........................ 10-2023-0098170

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .. H10D 30/6735; H10D 30/014; H10D 30/43; H10D 30/6757; H10D 62/115;
(Continued)

(56) References Cited

U.S. PATENT DOCUMENTS 11,152,338 B2 10/2021 Wu et al.
11,296,199 B2 * 4/2022 Ju ........................ H10D 30/014
(Continued)

OTHER PUBLICATIONS

Search Report dated Aug. 12, 2024 for corresponding application No. EP 24165909.3.

*Primary Examiner* — Victor A Mandala
(74) *Attorney, Agent, or Firm* — Muir Patent Law, PLLC

(57) ABSTRACT

A semiconductor device includes a substrate; an active region extending in a first, horizontal, direction on the substrate, and including a first active pattern at a first height above a bottom surface of the substrate in a vertical direction and having a first width in a second, horizontal, direction, a second active pattern having a second width in the second direction different from the first width, and a transition active pattern connecting the first active pattern to the second active pattern; gate structures intersecting the active region each gate structure extending in the second direction across the substrate; source/drain regions disposed on sides of the gate structures, and including a first source/drain region disposed on the first active pattern, a second source/drain region disposed on the second active pattern, and a transition source/drain region disposed on the transition active pattern. Each of the source/drain regions is disposed on the active region and includes a first epitaxial layer having a recessed upper surface and a second epitaxial layer disposed on the first epitaxial layer, at a second height above a bottom surface of the substrate in a vertical direction, a first sidewall thickness of the first epitaxial layer of the first source/drain region in the first direction is different from a second sidewall thickness of the first epitaxial layer of the second source/drain region in the first direction, at the second height, thicknesses of opposing sidewalls of the first epitaxial layer of the transition source/drain region in the first direction are different, and a vertical level of a lower-
(Continued)

most end of the second epitaxial layer of the first source/drain region, a vertical level of a lowermost end of the second epitaxial layer of the second source/drain region, and a vertical level of a lowermost end of the second epitaxial layer of the transition source/drain region are different from each other.

20 Claims, 30 Drawing Sheets

(51) Int. Cl.

| | |
|---|---|
| ***H10D 30/43*** | (2025.01) |
| ***H10D 62/10*** | (2025.01) |
| ***H10D 62/13*** | (2025.01) |
| ***H10D 64/01*** | (2025.01) |

(52) U.S. Cl.
CPC ....... *H10D 30/6757* (2025.01); *H10D 62/115* (2025.01); *H10D 62/118* (2025.01); *H10D 62/151* (2025.01); *H10D 64/017* (2025.01); *H10D 64/021* (2025.01)

(58) Field of Classification Search
CPC .. H10D 62/118; H10D 62/151; H10D 64/017; H10D 64/021; H10D 30/797; H10D 64/256; H10D 62/121; H10D 62/822; H10D 84/83; H10D 84/0128; H10D 89/10; H10D 84/0133; H10D 84/038; H10D 84/834; B82Y 10/00
See application file for complete search history.

(56) References Cited

U.S. PATENT DOCUMENTS

| | | | | |
|---|---|---|---|---|
| 2013/0069081 | A1* | 3/2013 | Blatchford | H10D 30/60 257/E21.409 |
| 2017/0358565 | A1 | 12/2017 | Hensel et al. | |
| 2020/0075428 | A1 | 3/2020 | Venigalla et al. | |
| 2020/0105752 | A1 | 4/2020 | Liaw | |
| 2022/0093743 | A1 | 3/2022 | Wang et al. | |
| 2022/0209013 | A1* | 6/2022 | Kim | H10D 30/014 |
| 2022/0320312 | A1* | 10/2022 | Park | H10D 30/014 |
| 2022/0392894 | A1 | 12/2022 | More et al. | |
| 2023/0010717 | A1 | 1/2023 | Wang et al. | |
| 2023/0078381 | A1* | 3/2023 | Liebmann | H10D 84/83 257/401 |
| 2023/0086084 | A1 | 3/2023 | Yun et al. | |
| 2024/0008242 | A1* | 1/2024 | Xie | H10D 89/10 |
| 2024/0120376 | A1* | 4/2024 | Lin | H10D 30/014 |
| 2025/0081526 | A1* | 3/2025 | Shin | H10D 30/014 |

* cited by examiner

FIG. 10C
144
143
142
141
120
110
101
III1
III1'
105A
Wa
III2
III2'
105T
Wt
III3
III3'
105B
Wb
105
105A
105B
105T
Z
Y
X

SEMICONDUCTOR DEVICE

CROSS-REFERENCE TO RELATED APPLICATION(S)

This application claims benefit of priority to Korean Patent Application No. 10-2023-0098170 filed on Jul. 27, 2023 in the Korean Intellectual Property Office, the disclosure of which is incorporated herein by reference in its entirety.

BACKGROUND

Example embodiments of the present disclosure relate to a semiconductor device.

As demand for high performance, speed, and/or multi-functionality of semiconductor devices has increased, integration density of semiconductor devices have also increased. In manufacturing semiconductor devices having fine patterns in response to the trend for high integration density of semiconductor devices, it may be necessary to implement patterns having a fine width or a fine spacing. Also, to overcome limitations in operation properties according to reduction of a size of planar MOSFET (metal oxide semiconductor FET), there have been efforts to develop a semiconductor device including FinFETs having a three-dimensional channel.

SUMMARY

An example embodiment of the present disclosure provides a semiconductor device having improved reliability.

According to an example embodiment of the present disclosure, a semiconductor device includes a substrate; an active region including: a first active pattern extending in a first, horizontal, direction on the substrate and, at a first height above a bottom surface of the substrate in a third, vertical, direction, having a first width in a second, horizontal, direction perpendicular to the first direction, a second active pattern extending in the first direction and, at the first height, having a second width in the second direction smaller than the first width, and a transition active pattern extending in the first direction and connecting the first active pattern to the second active pattern; gate structures intersecting the active region and extending in the second direction on the substrate; a plurality of sets of channel layers, each set including channel layers extending in the first direction, disposed in consecutive order from the active region, and spaced apart from each other in the third direction, which is perpendicular to an upper surface of the substrate, and each set surrounded by a respective gate structure on the active region; and source/drain regions disposed sides of the gate structures, and including a first source/drain region disposed on the first active pattern, a second source/drain region disposed on the second active pattern, and a transition source/drain disposed on the transition active pattern. The active region is symmetrical in the second direction with respect to a central axis of the active region extending in the first direction, each of the source/drain regions is disposed on the active region and includes a first epitaxial layer disposed on a first set of the plurality of channel layers and a second set of the plurality of channel layers, and a second epitaxial layer disposed on the first epitaxial layer, at a second height above the bottom surface of the substrate in the third direction, a first sidewall thickness of the first epitaxial layer of the first source/drain region in the first direction is greater than a second sidewall thickness of the first epitaxial layer of the second source/drain region in the first direction, and at the second height, the first epitaxial layer of the transition source/drain region has a first sidewall having a first transition sidewall thickness in the first direction and a second transition sidewall having a second transition sidewall thickness in the first direction, smaller than the first transition sidewall thickness.

According to an example embodiment of the present disclosure, a semiconductor device includes a substrate; an active region extending in a first, horizontal, direction on the substrate, and including a first active pattern at a first height above a bottom surface of the substrate in a vertical direction and having a first width in a second, horizontal, direction, a second active pattern having a second width in the second direction different from the first width, and a transition active pattern connecting the first active pattern to the second active pattern; gate structures intersecting the active region each gate structure extending in the second direction across the substrate; source/drain regions disposed on sides of the gate structures, and including a first source/drain region disposed on the first active pattern, a second source/drain region disposed on the second active pattern, and a transition source/drain region disposed on the transition active pattern. Each of the source/drain regions is disposed on the active region and includes a first epitaxial layer having a recessed upper surface and a second epitaxial layer disposed on the first epitaxial layer, at a second height above a bottom surface of the substrate in a vertical direction, a first sidewall thickness of the first epitaxial layer of the first source/drain region in the first direction is different from a second sidewall thickness of the first epitaxial layer of the second source/drain region in the first direction, at the second height, thicknesses of opposing sidewalls of the first epitaxial layer of the transition source/drain region in the first direction are different, and a vertical level of a lowermost end of the second epitaxial layer of the first source/drain region, a vertical level of a lowermost end of the second epitaxial layer of the second source/drain region, and a vertical level of a lowermost end of the second epitaxial layer of the transition source/drain region are different from each other.

According to an example embodiment of the present disclosure, a semiconductor device includes a substrate; an active region extending in a first direction on the substrate, and including a first active pattern having a first width in a second direction crossing the first direction, a second active pattern having a second width in the second direction smaller than the first width, and a transition active pattern connecting the first active pattern to the second active pattern, gate structures intersecting the active region on the substrate and extending in the second direction; a plurality of sets of channel layers, each set including channel layers extending in the first direction, disposed in consecutive order from the active region, and spaced apart from each other in a third direction perpendicular to an upper surface of the substrate, and each set surrounded by a respective gate structure on the active region, the plurality of sets of channel layers arranged apart from each other in the first direction; and source/drain regions disposed between gate structures adjacent each other in the first direction, and including a first source/drain region disposed on the first active pattern, a second source/drain region disposed on the second active pattern, and a transition source/drain region disposed on the transition active pattern. Each of the source/drain regions is disposed on the active region and includes a first epitaxial layer disposed between adjacent sets of the plurality of channel layers and a second epitaxial layer disposed on the first epitaxial layer, at a first vertical height above a bottom surface of the substrate, the transition source/drain region has a first transition sidewall thickness, in the first direction, of the first epitaxial layer of the transition source/drain region and a second transition sidewall thickness, smaller than a first transition sidewall thickness, and a vertical level of a lowermost end of the second epitaxial layer of the transition source/drain region is higher than a vertical level of a lowermost end of the second epitaxial layer of the first source/drain region and is lower than a vertical level of a lowermost end of the second epitaxial layer of the second source/drain region.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
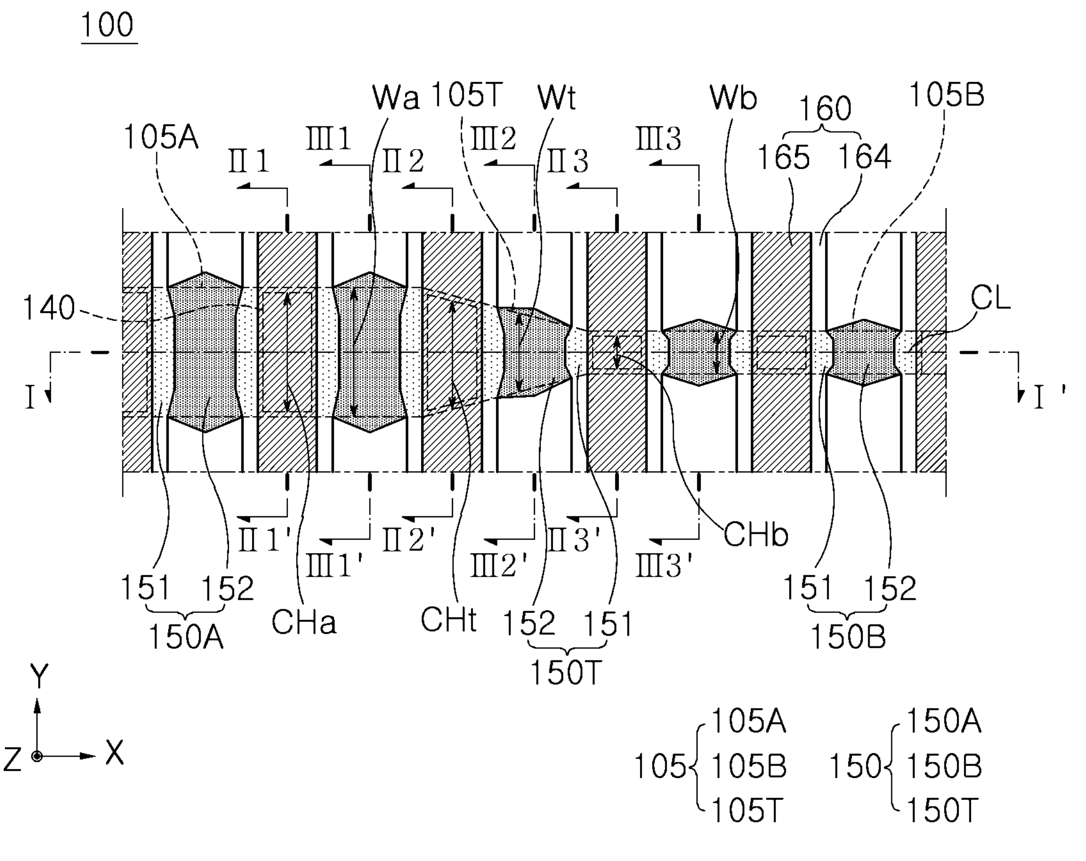
FIG. 1 is a plan diagram illustrating a semiconductor device according to an example embodiment of the present disclosure.

FIG. 1 is a plan diagram illustrating a semiconductor device according to an example embodiment. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips. The semiconductor devices disclosed in various embodiments herein include gate-all-around type transistors, also described as nano-sheet transistors, which include gate-all-around, or nanosheet, channel regions.

Figure 2A:
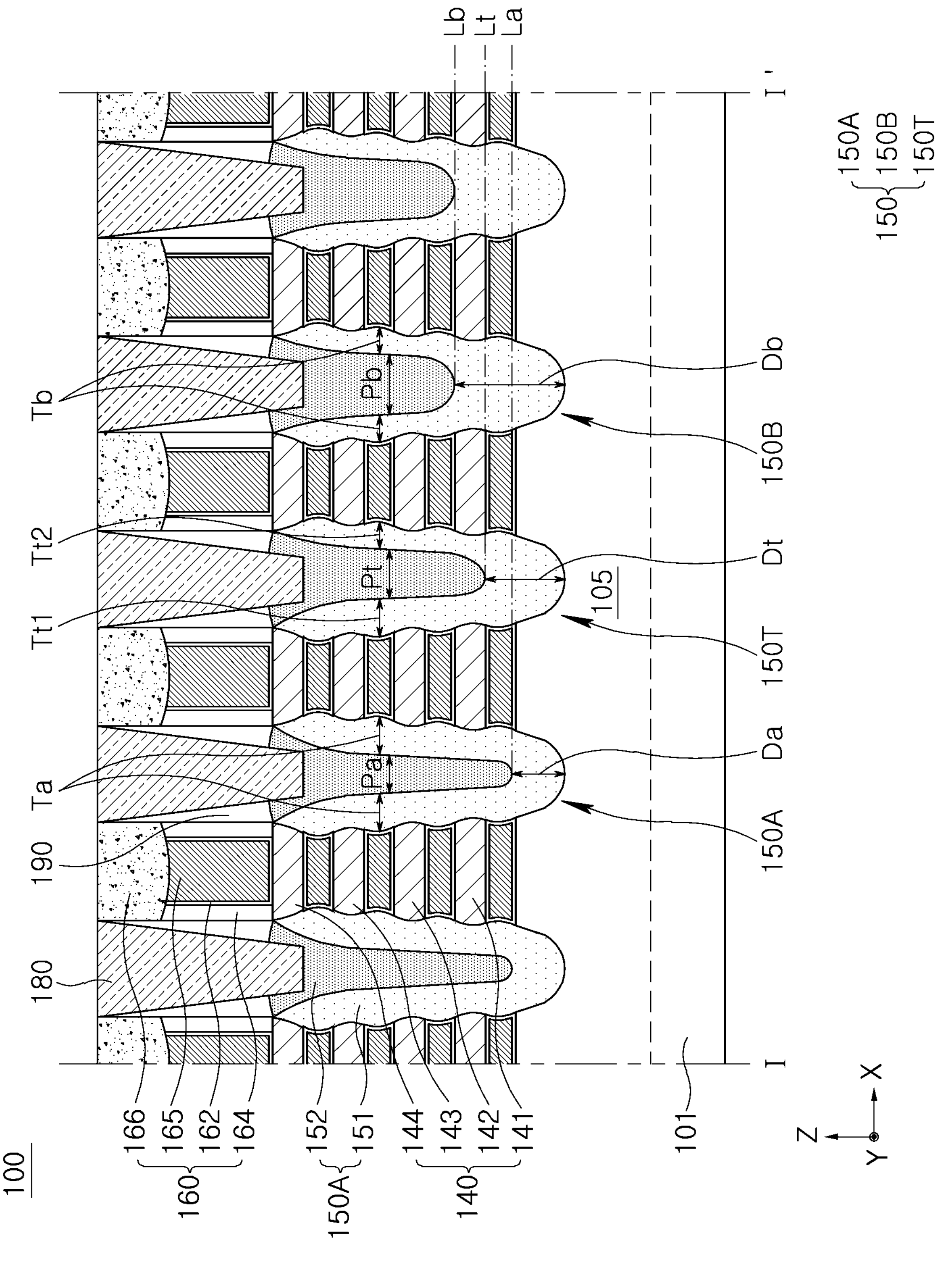
FIGS. 2A to 2C are cross-sectional diagrams illustrating a semiconductor device according to an example embodiment of the present disclosure.
Figure 2B:
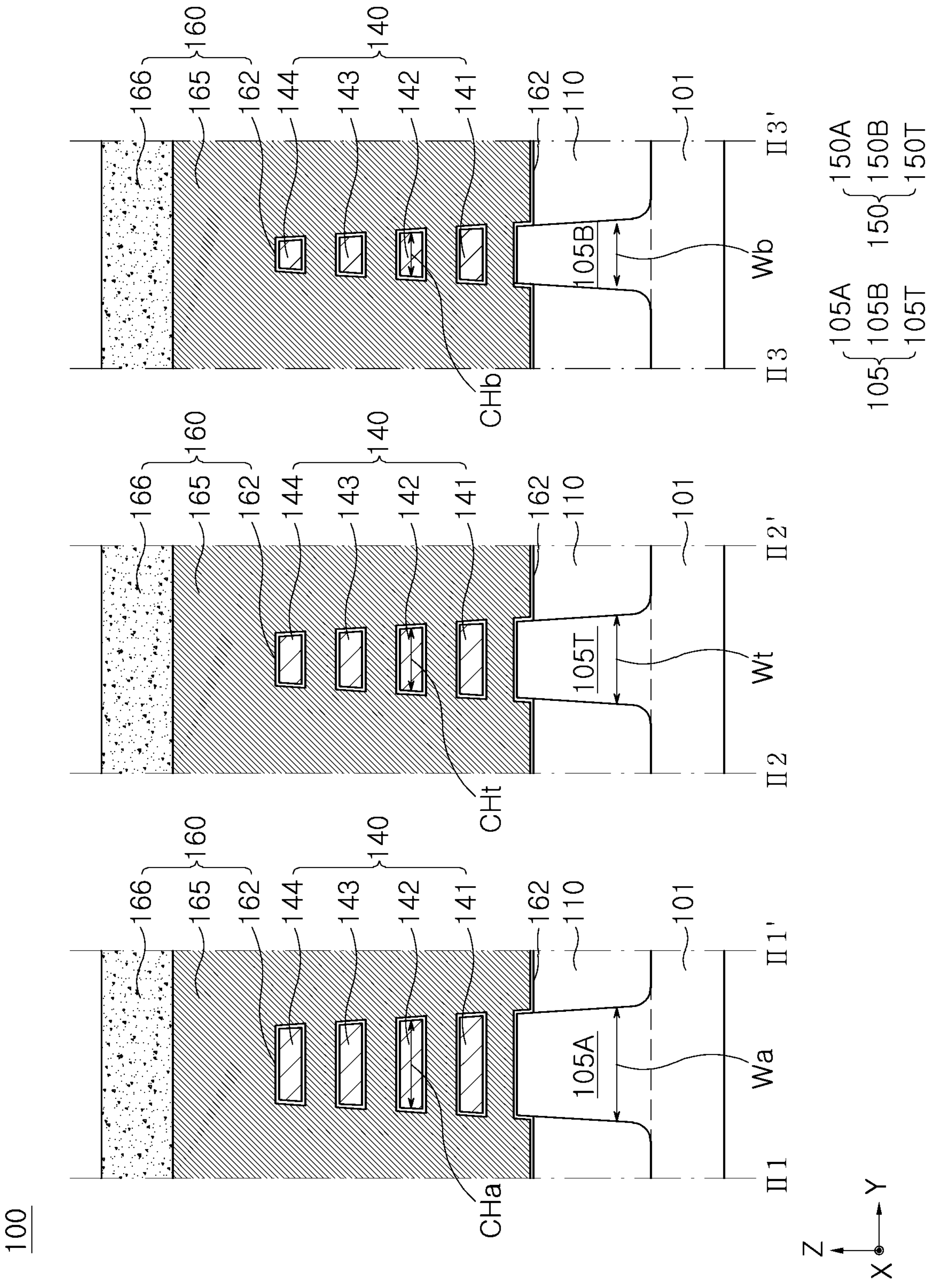
Figure 2C:
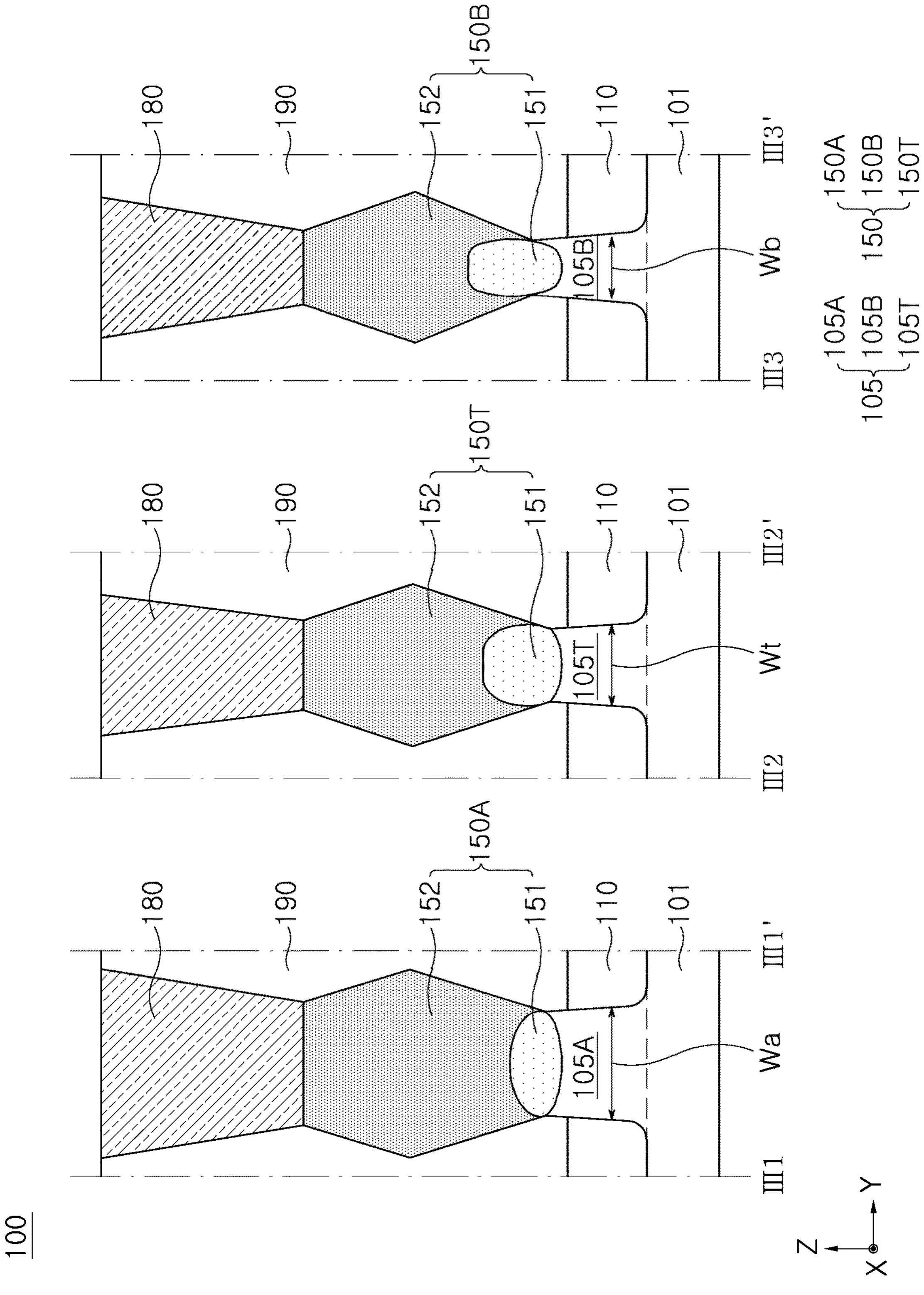

FIGS. 2A to 2C are cross-sectional diagrams illustrating a semiconductor device according to an example embodiment. FIG. 2A illustrates a cross-sectional surface of the semiconductor device in FIG. 1 taken along line I-I'. FIG. 2B illustrates a cross-sectional surface of the semiconductor device in FIG. 1 taken along lines II1-II1', II2-II2', and II3-II3'. FIG. 2C illustrates cross-sectional surfaces of the semiconductor device in FIG. 1 taken along lines III1-III1', III2-III2', and III3-III3'. For ease of description, FIG. 1 illustrates only a portion of components of the semiconductor device.

Referring to FIGS. 1 to 2C, the semiconductor device 100 may include a substrate 101, an active region 105 including a first active pattern 105A, a second active pattern 105B, and a transition active pattern 105T, a gate structures 160 extending by intersecting the active region 105, and each including a gate electrode 165, channel structures 140 including first to fourth channel layers 141, 142, 143, and 144 disposed vertically and spaced apart from each other on the active region 105, source/drain regions 150 in contact with the channel structures 140, and contact plugs 180 connected to the source/drain regions 150. The semiconductor device 100 may further include a device isolation layer 110, gate dielectric layers 162, gate spacer layers 164, a gate capping layer 166, and an interlayer insulating layer 190.

In the semiconductor device 100, the active region 105 may have a fin structure, the gate electrode 165 may be disposed between the active region 105 and the channel structure 140, between the first to fourth channel layers 141, 142, 143, and 144 of the channel structure 140, and on the channel structure 140. Accordingly, the semiconductor device 100 may include transistors having a multi-bridge channel FET structure (MBCFET™), which is a gate-all-around type field effect transistor.

The substrate 101 may have an upper surface extending in the X-direction and the Y-direction. The substrate 101 may include or be formed of a semiconductor material, such as a group IV semiconductor, a group III-V compound semiconductor, or a group II-VI compound semiconductor. For example, group IV semiconductors may include silicon, germanium, or silicon-germanium. The substrate 101 may be provided as a bulk wafer, an epitaxial layer, a silicon on insulator layer (SOI), or a semiconductor on insulator layer (SeOI).

The substrate 101 may include an active region 105 disposed in an upper portion of the substrate 101. The active region 105 may be defined by the device isolation layer 110 in the substrate 101 and may be disposed to extend lengthwise in the first direction, for example, the X-direction. An item, layer, or portion of an item or layer described as extending "lengthwise" in a particular direction has a length in the particular direction and a width perpendicular to that direction, where the length is greater than the width. In some examples, the active region 105 may be described as a component separate from the substrate 101.

The active region 105 may include a first active pattern 105A extending in the first direction (e.g., the X-direction) on the substrate 101 and having a first width Wa in the second direction (e.g., the Y-direction), a second active pattern 105B having a second width Wb in the second direction different from the first width Wa, and a transition active pattern 105T connecting the first active pattern 105A to the second active pattern 105B. The first width Wa and second width Wb may refer to a width of each active pattern at a particular vertical level (e.g., at a particular height above the bottom surface of the substrate), an example bottom surface is depicted in FIGS. 2A-2C, but the embodiments are not limited thereto. In example embodiments, at a particular vertical level, the second width Wb may be smaller than the first width Wa. The transition active pattern 105T may provide non-parallel opposite side surfaces by a portion of which a width in the second direction (e.g., the Y-direction) at a particular vertical level may change. Each of the first active pattern 105A and the second active pattern 105B may have a constant width at a particular vertical level, and the width Wt of the transition active pattern 105T in the second direction (e.g., the Y-direction) at a particular vertical level may gradually decrease or increase along the first direction (e.g., the X-direction).

The active region 105 may partially protrude from the device isolation layer 110, and an upper surface of the active region 105 may be disposed at a level higher than a level of an upper surface of the device isolation layer 110. An upper surface of the active region 105 may have a downwardly curved shape. In example embodiments, the upper surface of each of the first active pattern 105A, second active pattern 105B, and transition active pattern 105T may have a downwardly curved shape (e.g., a concave shape). The active region 105 may include a portion of the substrate 101 (e.g., formed by etching other portions of the substrate), or may include an epitaxial layer grown from the substrate 101. In either case, the active region 105 is provided with the substrate 101. The active region 105 may be partially recessed into both sides of the gate structures 160 and recess regions may be formed, and source/drain regions 150 may be disposed in the recess regions. The source/drain region 150 may extend from a lower surface of the interlayer insulating layer 190 disposed between the gate structures 160 and may be disposed within the active region 108.

In example embodiments, the active region 105 may or may not include a well region including impurities. For example, in the case of a P-type transistor (PFET), the well region may include N-type impurities such as phosphorus (P), arsenic (As), or antimony (Sb), and in the case of an N-type transistor (nFET), the well region may include P-type impurities such as boron (B), gallium (Ga), or indium (In). For example, the well region may be disposed at a predetermined depth from the upper surface of the active region 105.

In example embodiments, the active region 105 may be symmetrical in the second direction (e.g., the Y-direction) with respect to a central axis CL of the active region 105 extending in the first direction (e.g., the X-direction). This structure affects the prevention of contact between the second epitaxial layer 152 and the gate structures 160, such that a semiconductor device having improved electrical properties and reliability may be provided.

The device isolation layer 110 may define an active region 105 in the substrate 101. The device isolation layer 110 may be formed, for example, by a shallow trench isolation (STI) process. The device isolation layer 110 may expose an upper surface of active region 105 and may partially expose the upper portion. In some example embodiments, the device isolation layer 110 may have a wavy upper surface such that a level thereof may increase toward the active region 105. The device isolation layer 110 may be formed of an insulating material. The device isolation layer 110 may be, for example, oxide, nitride, or a combination thereof.

The gate structures 160 may be disposed to intersect the active region 105 and the channel structures 140 and to extend in the second direction, for example, the Y-direction, on the active region 105 and the channel structures 140. A functional channel region of transistors may be formed in the active region 105 and/or the channel structures 140 intersecting the gate electrodes 165 of the gate structures 160. Each of the gate structures 160 may include a gate electrode 165, gate dielectric layers 162 between the gate electrode 165 and the first to fourth channel layers 141, 142, 143, and 144, and a gate spacer layers 164 on side surfaces of the gate electrode 165. In example embodiments, each of the gate structures 160 may further include a gate capping layer 166 on the upper surface of the gate electrode 165.

The gate dielectric layers 162 may be disposed between the active region 105 and the gate electrode 165 and between the channel structure 140 and the gate electrode 165, and may be disposed to cover at least a portion of the surfaces of the gate electrode 165. For example, gate dielectric layers 162 may be disposed to surround the entirety of surfaces other than the upper surface of the gate electrode 165. The gate dielectric layers 162 may extend to a region between the gate electrode 165 and the gate spacer layers 164, but an example embodiment thereof is not limited thereto. The gate dielectric layers 162 may include or be formed of oxide, nitride, or a high-K material. The high-K material may refer to a dielectric material having a higher dielectric constant than that of silicon oxide ($SiO_2$). The high-k material may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In example embodiments, the gate dielectric layer 162 may be formed of a multilayer film.

The gate electrode 165 may fill a space between the first to fourth channel layers 141, 142, 143, and 144 on the active region 105 and may extend to the active region 105. The gate electrode 165 may be spaced apart from the first to fourth channel layers 141, 142, 143, and 144 by the gate dielectric layers 162. The gate electrode 165 may include or be formed of a conductive material, for example, a metal nitride such as titanium nitride film (TiN), tantalum nitride film (TAN), or tungsten nitride film (WN), and/or a metal material such as aluminum (Al), tungsten (W), or molybdenum (Mo) or a semiconductor material such as doped polysilicon. In example embodiments, the gate electrode 165 may include two or more multilayers.

The gate spacer layers 164 may be disposed on both side surfaces (e.g., opposite side surfaces) of the gate electrode 165 on the channel structure 140. The gate spacer layers 164 may insulate the source/drain regions 150 from the gate electrode 165. The gate spacer layers 164 may have a multi-layer structure in example embodiments. The gate spacer layers 164 may be formed of oxide, nitride and oxynitride, and in some embodiments may be formed of a low-K film.

The gate capping layer 166 may be disposed on the gate electrode 165, and a bottom surface thereof may be surrounded by (e.g., covered by) the gate electrode 165 and the gate spacer layers 164.

The channel structures 140 may be disposed on the active region 105 in region in which the active region 105 intersects the gate structures 160. Each of the channel structures 140 may include first to fourth channel layers 141, 142, 143, and 144, which are a plurality of channel layers spaced apart from each other in the third direction (e.g., Z-direction) perpendicular to the upper surface of the substrate 101. The first to fourth channel layers 141, 142, 143, and 144 may be disposed in order from the active region 105. For example, a plurality of sets of channel layers each set including channel layers extending in the first direction (e.g., a first channel layer 141 pattern, second channel layer 142 pattern, third channel layer 143 pattern, and fourth channel layer 144 pattern), may be disposed in consecutive order from the active region 105, and spaced apart from each other in the third direction (e.g., Z-direction). Each set of channel layers may be surrounded by a respective gate structure 160 on the active region 105. The channel structures 140 may be connected to the source/drain regions 150. The channel structures 140 may have a width equal to or similar to the gate structures 160 in the X-direction, and may have a width equal to or smaller than that of the active region 105 in the Y-direction. On the cross-sectional surface in the Y-direction, the channel layer disposed in a lower portion among the first to fourth channel layers 141, 142, 143, and 144 may have a width equal to or greater than that of the channel layer disposed in an upper portion.

In example embodiments, the plurality of channel layers 141, 142, 143, and 144 disposed on the first active pattern 105A may have a width CHa of the first channel in the second direction (e.g., the Y-direction), the plurality of channel layers 141, 142, 143, and 144 disposed on the second active pattern 105B may have a width CHb of the second channel in the second direction (e.g., the Y-direction), smaller than the width CHa of the first channel, and the plurality of channel layers 141, 142, 143, and 144 disposed on the transition active pattern 105T may have a width of the transition channel in the second direction (e.g., the Y-direction) CHt, smaller than the width CHa of the first channel and greater than the width CHb of the second channel. For example, for any given vertical level (e.g., height above a bottom surface of the substrate 101), a width in the second direction (e.g., the Y-direction) of a channel layer disposed on the first active pattern 105A may be greater than a width in the second direction (e.g., the Y-direction) of a channel layer disposed on the second active pattern 105B, and a width in the second direction (e.g., the Y-direction) of a channel layer disposed on the transition active pattern 105T may be greater than the width in the second direction (e.g., the Y-direction) of the channel layer disposed on the second active pattern 105B and less than the width in the second direction (e.g., the Y-direction) of the channel layer disposed on the first active pattern 105A. Stated another way, each set of channel layers disposed on the first active pattern 105A may include consecutively ordered channel layers having a first set of widths, and each set of channel layers disposed on the second active pattern 105B may include consecutively ordered channel layers having a second set of widths in the second direction, where each width of the second set of widths smaller than a respective width of the first set of widths. On the plan diagram, each of the width CHa of the first channel and the width CHb of the second channel may have a constant width, and the width CHt of the transition channel may gradually increase or decrease along the first direction (e.g. X-direction). In one embodiment, each set of channel layers disposed on the transition active pattern 105T may include consecutively ordered channel layers having a third set of widths in the second direction, each width of the third set of widths being smaller than a respective width of the first set of widths and greater than a respective width of the second set of widths.

The number of channel layers included in the channel structure 140 and the shape thereof may vary in example embodiments. As illustrated in FIG. 2A, the side surfaces of the first to third channel layers 141, 142, and 143 in the X-direction may have an outwardly curved shape, and the uppermost fourth channel layer 144 may have side surfaces inclined such that a width thereof may decrease toward the active region 105. The channel structure 140 may have a shape in which a width, in the X-direction, of a channel layer closer to the active region 105 may increase (e.g., compared to a width, in the X-direction, of an adjacent channel layer further from the active region 105. At least one of the first to fourth channel layers 141, 142, 143, and 144 may have a reduced width such that the side surfaces may be disposed below the gate structures 160 in the X-direction (e.g., to vertically overlap with at least one of the gate structures 160). However, in example embodiments, the shape and the relative width of the side surfaces of the first to fourth channel layers 141, 142, 143, and 144 may be varied and are not limited to the shape illustrated in FIG. 2. For example, in some example embodiments, the first to fourth channel layers 141, 142, 143, and 144 may have side surfaces extending vertically in the third direction (e.g., the Z-direction).

The channel structures 140 may be formed of a semiconductor material, and may include, for example, at least one of silicon (Si), silicon germanium (SiGe), and germanium (Ge). For example, the channel structures 140 may be formed of the same material as that of the active region 105. In some example embodiments, the channel structures 140 may include an impurity region disposed in a region adjacent to the source/drain regions 150.

The source/drain regions 150 may be disposed in recess regions partially recessed into an upper portion of the active region 105 on opposite sides of the gate structures 160 in the X-direction. The source/drain region 150 may be disposed to cover the side surfaces in the X-direction of each of the first to fourth channel layers 141, 142, 143, and 144 of the channel structures 140. The uppermost surfaces of the source/drain regions 150 may be disposed at a level the same as or similar to a level of the lower surface of the gate electrodes 165 on the channel structures 140, and the level may vary in example embodiments. The source/drain regions 150 may include or be formed of at least one semiconductor material, for example, silicon (Si) and/or germanium (Ge), and may further include impurities.

In example embodiments, the source/drain regions 150 may include a first source/drain region 150A disposed on the first active pattern 105A, a second source/drain region 150B disposed on the second active pattern 105B, and a transition source/drain region 150T disposed on the transition active pattern 105T.

Each of the source/drain regions 150 may include a first epitaxial layer 151 and a second epitaxial layer 152 disposed on the first epitaxial layer 151. According to another example embodiment, the source/drain regions 150 may further include a plurality of epitaxial layers in addition to the first epitaxial layer 151 and the second epitaxial layer 152.

For each set of first to fourth channel layers 141, 142, 143, and 144, a first epitaxial layer 151 may cover side surfaces in the X-direction of the first to fourth channel layers 141, 142, 143, and 144, and may cover side surfaces in the X-direction of the gate structures 160 formed below and around the channel structures 140. The first epitaxial layer 151 may cover an internal side surface and a bottom surface of the recess region in which the source/drain region 150 is disposed, and may extend as an integrated layer in the source/drain region 150. The first epitaxial layer 151 may have a side surface protruding curvedly below each channel structures 141, 142, 143, and 144 toward the gate structures 160, and accordingly, the side surface may have a curve. The overall surface of the first epitaxial layer 151 that contacts sides of a stack of alternating channel structures 140 may have a wave shape, also described as a concave-convex shape. During a manufacturing process, the first epitaxial layer 151 may be grown to a relatively small thickness on the side surface of the fourth channel layer 144 due to the gate spacer layers 164 of the gate structures 160. On the plan diagram, the external side surface of at least a portion of the first epitaxial layer 151 and the second epitaxial layer 152 may be a facet along a crystal plane, but an example embodiment thereof is not limited thereto. The source/drain regions 150 are not limited to the shapes illustrated. Depending on whether the source/drain regions 150 are N-type or P-type transistors, the source/drain regions 150 may be formed of different materials or may have different shapes. The cross-sectional surface of the source/drain regions 150 in the second direction (e.g., the Y-direction) may have a pentagonal shape, a hexagonal shape, or a polygonal shape having gentle angles, but example embodiments thereof are not limited thereto.

Since the first epitaxial layer 151 is formed by epitaxial growth from the sidewall of the plurality of channel layers 141, 142, 143, and 144, a thickness of the sidewall of the plurality of channel layers 141, 142, 143, and 144 may be determined by a width in the second direction (e.g., the Y-direction). As illustrated in FIG. 2A, at a particular vertical level, a thickness Ta of the first sidewall of the first epitaxial layer 151 of the first source/drain region 150A in the first direction (e.g., the X-direction) may be different from a thickness Tb of the second sidewall of the first epitaxial layer 151 of the second source/drain region 150B in the first direction (e.g., the X-direction). In example embodiments, since the width CHa of the first channel may be greater than the width CHb of the second channel, the thickness Ta of the first sidewall of the first epitaxial layer 151 of the first source/drain region 150A along the first direction (e.g., the X-direction) may be greater than a thickness Tb of the second sidewall of the first epitaxial layer 151 of the second source/drain region 150B along the first direction (e.g., the X-direction) on one level.

Since the width in the second direction (e.g., the Y-direction) of the plurality of channel layers 141, 142, 143, and 144 in contact with both side surfaces of the transition source/drain region 150T may be different, the thicknesses in the first direction (e.g., the X-direction) of the opposing sidewalls of the first epitaxial layer 151 of the transition source/drain region 150T may be different at any particular vertical level. In example embodiments, at a particular vertical level, the transition source/drain region 150T may have a thickness Tt1 of the first transition sidewall along the first direction (e.g., the X-direction) of the first epitaxial layer 151 of the transition source/drain region 150T and a thickness Tt2 of the second transition sidewall smaller than the thickness Tt1 of the first transition sidewall. In one embodiment, this is because the width CHa of the first channel may be greater than the width CHb of the second channel. In example embodiments, the thickness Ta of the first sidewall may be substantially equal to the thickness Tt1 of the first transition sidewall, and the thickness Tb of the second sidewall may be substantially equal to the thickness Tt2 of the second transition sidewall, but an example embodiment thereof is not limited.

The second epitaxial layer 152 may cover the first epitaxial layer 151 and may fill the recess region. Other than the upper surface of the second epitaxial layer 152, the second epitaxial layer 152 may be surrounded by the first epitaxial layer 151. At certain heights, widths Pa, Pb, Pt along the X-direction of the second epitaxial layer 152 between adjacent first epitaxial layers 151 may be greater than respective thicknesses Ta, Tb, Tt1, Tt2 at the sidewall of each of the first epitaxial layer 151. In example embodiments, at a particular height, the width Pt of the second epitaxial layer 152 of the transition source/drain region 150T in the first direction (e.g., the X-direction) may be larger than the width Pa of the second epitaxial layer 152 of the first source/drain region 150A along the first direction (e.g., the X-direction) and may be smaller than the width Pb of the second epitaxial layer 152 of the second source/drain region 150B along the first direction (e.g., the X-direction).

The second epitaxial layer 152 may include or be formed of the same material as that of the first epitaxial layer 151, but a composition and/or doping concentration may be different from that of the first epitaxial layer 151. When the semiconductor device 100 is a pFET, the source/drain region 150 may include silicon germanium (SiGe), and a concentration of germanium (Ge) of the second epitaxial layer 152 may be higher than a concentration of germanium (Ge) of the first epitaxial layer 151. For example, a concentration of germanium (Ge) of the first epitaxial layer 151 may be in a range from about 1 at % to about 15 at %, and a concentration of germanium (Ge) of the second epitaxial layer 152 may be in a range from about 20 at % to about 100 at %. Also, the second epitaxial layer 152 may have a doping concentration of impurities higher than that of the first epitaxial layer 151. When the semiconductor device 100 is a pFET, impurities may be at least one of boron (B), gallium (Ga), and indium (In), and when the semiconductor device 100 is an nFET, the impurities may be phosphorus (P), arsenic (As), and antimony (Sb). Thus, according to these various embodiments, the first epitaxial layer 151 has a different material composition from the second epitaxial layer 152.

In example embodiments, on a cross-sectional surface viewed in the first direction (e.g., the X-direction) a level La (e.g., vertical height) of a lowermost end of the second epitaxial layer 152 of the first source/drain region 150A, a level Lb (e.g., vertical height) of a lowermost end of the second epitaxial layer 152 of the second source/drain region 150B, and a level Lt (e.g., vertical height) of a lowermost end of the second epitaxial layer 152 of the transition source/drain region 150T may be different. For example, on a cross-sectional surface in the first direction (e.g., the X-direction), the level Lt of the lowermost end of the second epitaxial layer 152 of the transition source/drain region 150T may be higher than the level La of the lowermost end of the second epitaxial layer 152 of the first source/drain region 150A, and may be lower than the level Lb of the lowermost end of the second epitaxial layer 152 of the second source/drain region 150B.

In example embodiments, on a cross-sectional surface viewed in the first direction (e.g., the X-direction) a thickness Dt from a lowermost end of the first epitaxial layer 151 of the transition source/drain region 150T to a lowermost end of the second epitaxial layer 152 of the transition source/drain region 150T may be greater than the thickness Da from the lowermost end of the first epitaxial layer 151 of the first source/drain region 150A to the lowermost end of the second epitaxial layer 152 of the first source/drain region 150A, and may be smaller than the thickness Db from the lowermost end of the first epitaxial layer 151 of the second source/drain region 150B to the lowermost end of the second epitaxial layer 152 of the second source/drain region 150B. This may be because the first width Wa in the second direction (e.g., the Y-direction) of the first active pattern 105A may be greater than the second width Wb in the second direction (e.g., the Y-direction) of the second active pattern 105B and the width Wt in the second direction (e.g., the Y-direction) of transition active pattern 105T may be smaller than the first width Wa and larger than the second width Wb.

Due to the above-described structure, the second epitaxial layer 152 of the transition source/drain region 150T may be spaced apart from the gate structures 160 (e.g., from the gate dielectric 162 and gate electrode portions 165 of the gate structures 160), such that leakage current occurring when the second epitaxial layer 152 and the gate structures 160 are in contact with each other may be prevented. Accordingly, a semiconductor device having improved electrical properties and reliability may be provided.

The interlayer insulating layer 190 may cover the source/drain regions 150 and the gate structures 160, and may be disposed to cover the device isolation layer 110. The interlayer insulating layer 190 may include or be formed of at least one of oxide, nitride, and oxynitride, and may include or be, for example, a low-K material. In example embodiments, the interlayer insulating layer 190 may include a plurality of insulating layers.

The contact plugs 180 may penetrate through the interlayer insulating layer 190, may be connected to the source/drain regions 150, and may apply an electrical signal to the source/drain regions 150. The contact plugs 180 may have an inclined side surface of which a width of the lower portion decreases further than the width of the upper portion depending on an aspect ratio, but an example embodiment thereof is not limited thereto. The contact plugs 180 may extend downwardly, for example, to a region below the lower surface of the fourth channel layer 144 on the channel structure 140, but an example embodiment thereof is not limited thereto. The contact plugs 180 may be in contact with the second epitaxial layers 152 of the source/drain regions 150. In another example embodiment, the contact plugs 180 may not be disposed to be recessed into the source/drain regions 150, but may be disposed to be in contact with the upper surface of the source/drain regions 150.

Each of the contact plugs 180 may include or be formed of a metal silicide layer disposed on a lower end including the lower surface, and may further include a barrier layer forming the side surfaces of the contact plug 180 and extending to the upper surface of the metal silicide layer. The barrier layer may include or may be, for example, a metal nitride such as a titanium nitride film (TiN), a tantalum nitride film (TaN), or a tungsten nitride film (WN). The contact plugs 180 may include or be a metal material such as aluminum (Al), tungsten (W), or molybdenum (Mo). In example embodiments, the number of conductive layers included in the contact plugs 180 and the arrangement form thereof may vary.

An interconnection structure such as a contact plug may be further disposed on the gate electrode 165, and an interconnection structure connected to the contact plugs 180 may be further disposed on the contact plugs 180.

In the description of example embodiments below, the descriptions overlapping those described above with reference to FIGS. 1 to 2C will not be provided.

Figure 3:
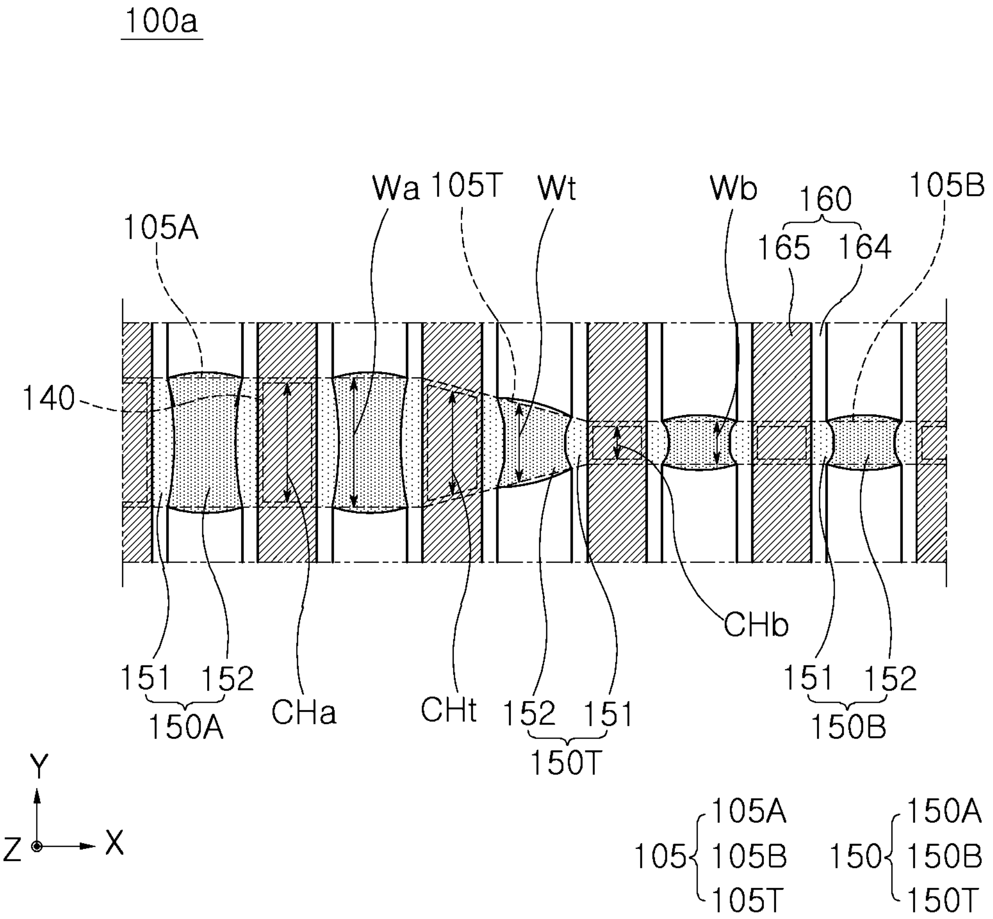
FIG. 3 is a plan diagram illustrating a semiconductor device according to an example embodiment of the present disclosure.

FIG. 3 is a plan diagram illustrating a semiconductor device according to an example embodiment.

Referring to FIG. 3, in a semiconductor device 100A, each of external side surfaces of the first epitaxial layer 151 and the second epitaxial layer 152 may have a round shape. In example embodiments, on the plan diagram, an external side surface of the first epitaxial layer 151 may have a rounded shape toward the second epitaxial layer 152. For example, on the plan diagram, the surface on which the first epitaxial layer 151 and the second epitaxial layer 152 are in contact with each other may have a rounded shape. Since the external side surface of the second epitaxial layer 152 may not be formed along a crystal plane, the external side surface may not have a facet and may have a round shape.

Figure 4:
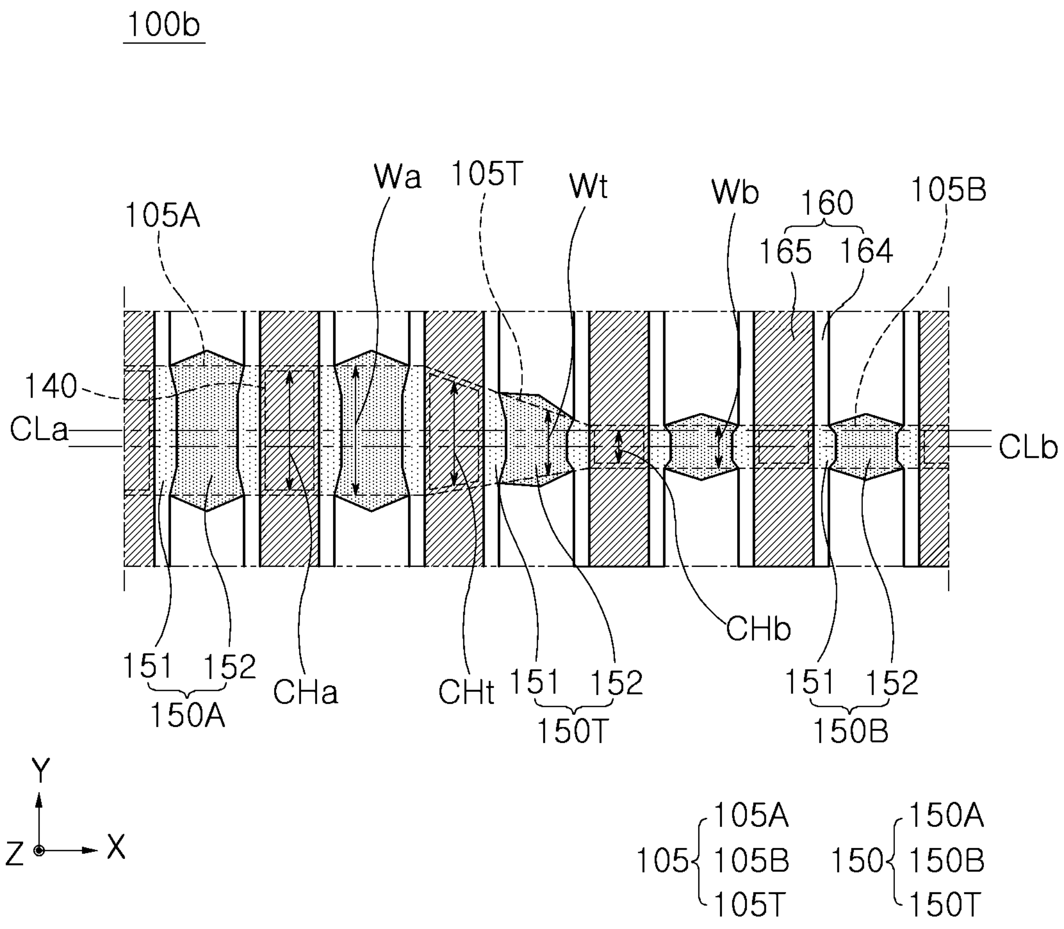
FIG. 4 is a plan diagram illustrating a semiconductor device according to an example embodiment of the present disclosure.

FIG. 4 is a plan diagram illustrating a semiconductor device according to an example embodiment.

Referring to FIG. 4, in a semiconductor device 100B, the first active pattern 105A may be symmetrical in the second direction (e.g., the Y-direction) with respect to a central axis CLa of the first active pattern 105A extending in the first direction (e.g., the X-direction), and the second active pattern 105B may be symmetrical in the second direction (e.g., the Y-direction) with respect to a central axis CLa of the second active pattern 105B extending in the first direction (e.g., the X-direction). In example embodiments, the central axis CLa of the first active pattern 105A and the central axis CLb of the second active pattern 105B may be shifted from each other. However, on the plan diagram, the second active pattern 105B may be disposed inside of the extension line of the first active pattern 105A (e.g., may fully overlap in the X-direction, from the plan view).

Figure 5:
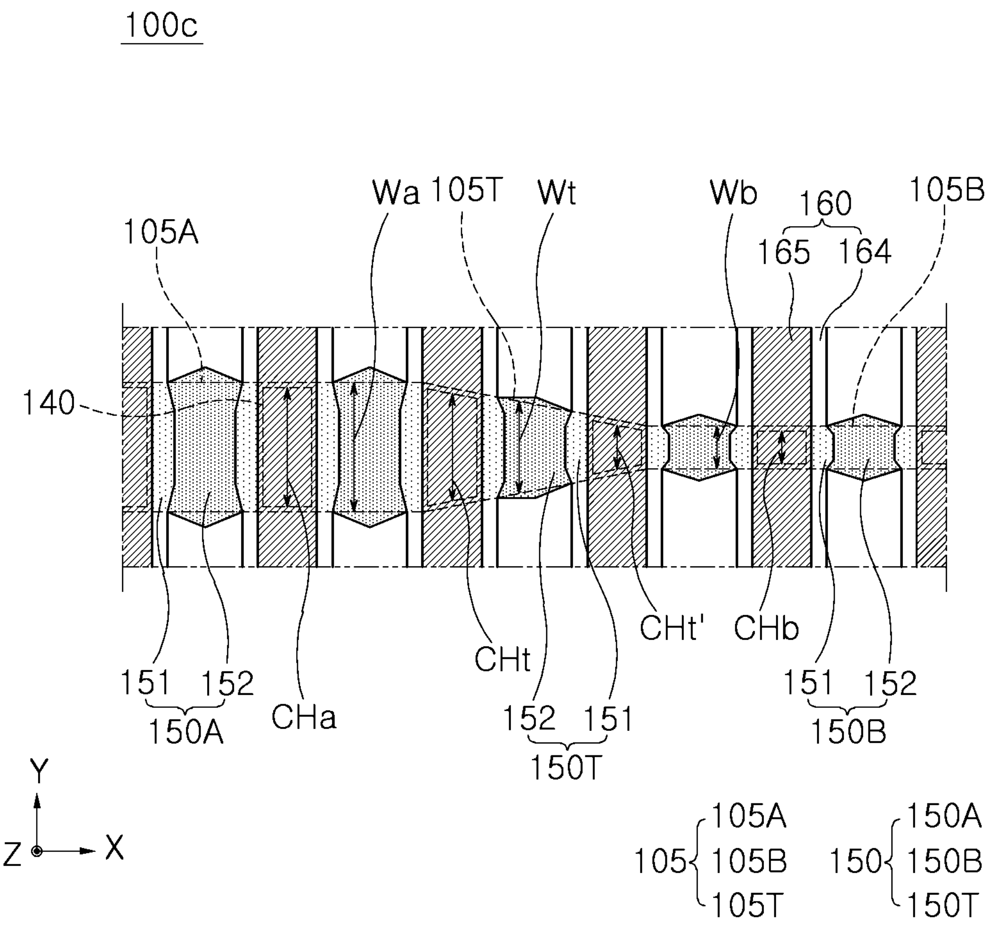
FIG. 5 is a plan diagram illustrating a semiconductor device according to an example embodiment of the present disclosure.

FIG. 5 is a plan diagram illustrating a semiconductor device according to an example embodiment.

Referring to FIG. 5, in a semiconductor device 100*c*, the transition active pattern 105T may extend in the first direction (e.g., the X-direction) and may vertically overlap two or more gate structures 160. In example embodiments, the channel structure 140 in contact with both sidewalls of the transition source/drain region 150T may have the widths CHt and CHt' of the transition channel. In example embodiments, a width CHt of the transition channel of the channel structure 140 disposed close to the channel structure 140 having the width Cha of the first channel may be larger than a width CHt' of the transition channel of the channel structure 140 disposed close to the channel structure 140 with the width CHb of the second channel. The widths CHt and CHt' of the transition channel of channel structure 140 may gradually increase or decrease in the first direction (e.g., the X-direction).

Figure 6A:
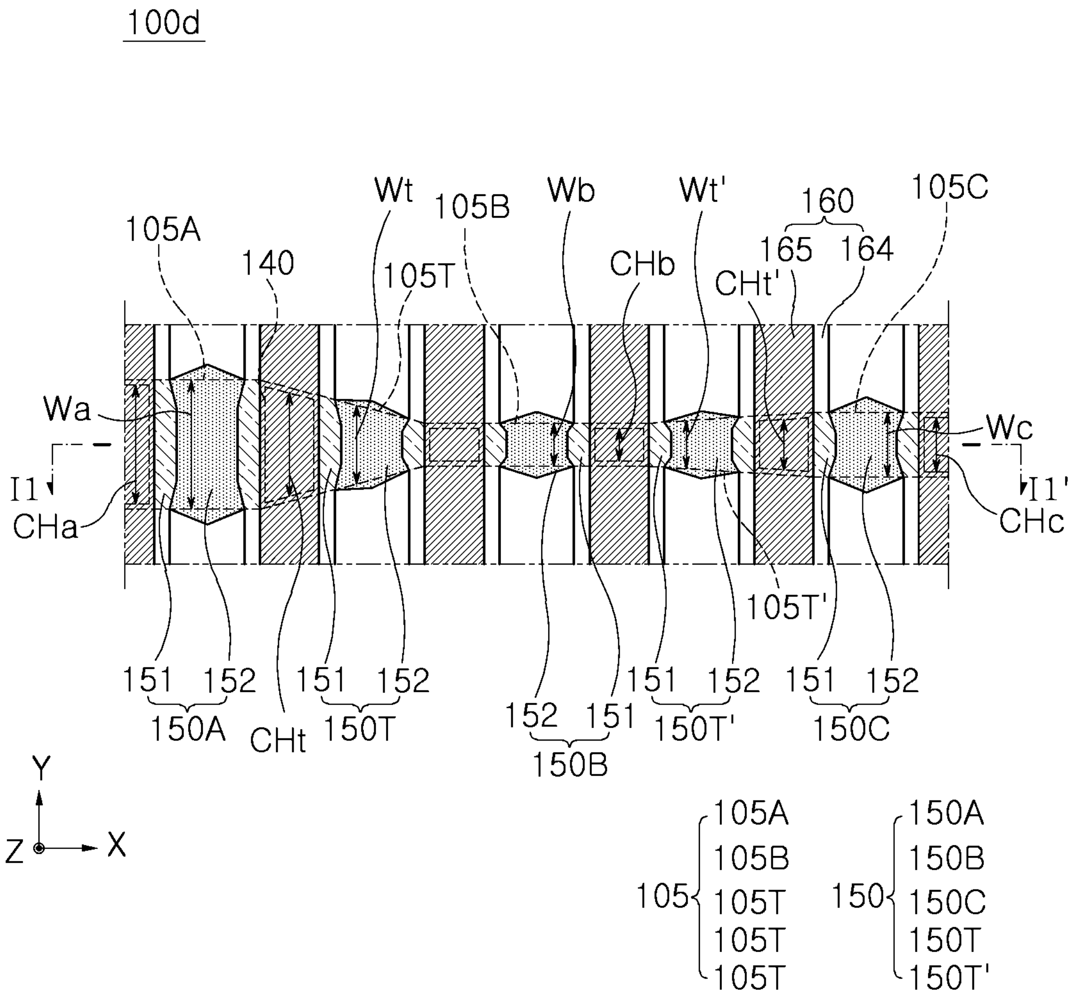
FIG. 6A is a plan diagram illustrating a semiconductor device according to an example embodiment of the present disclosure.

FIG. 6A is a plan diagram illustrating a semiconductor device according to an example embodiment.

Figure 6B:
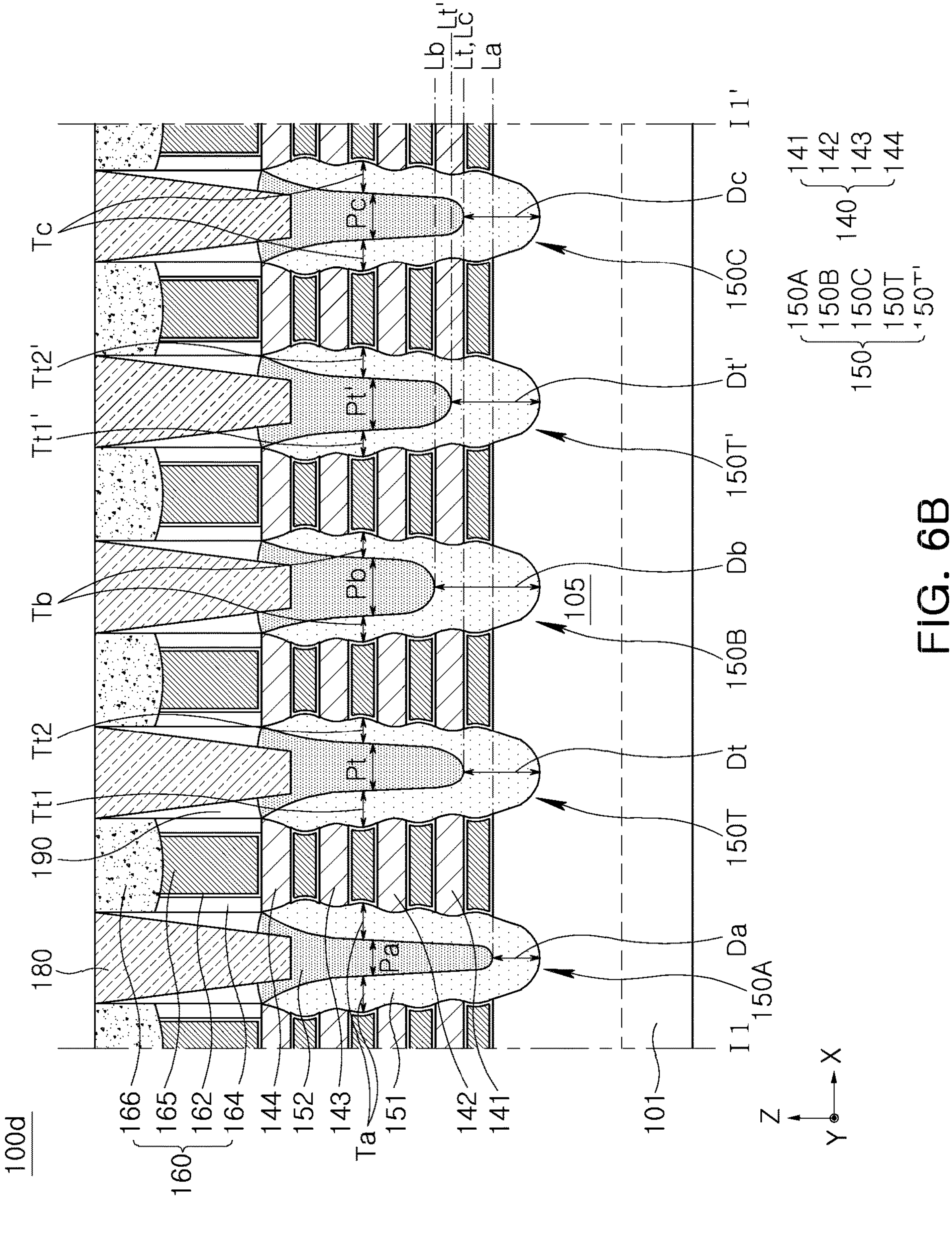
FIG. 6B is a plan diagram illustrating a semiconductor device according to an example embodiment of the present disclosure.

FIG. 6B is a plan diagram illustrating a semiconductor device according to an example embodiment, taken along line I1-I1' in FIG. 6A.

Referring to FIGS. 6A and 6B, in a semiconductor device 100*d*, the active region 105 may further include a third active pattern 105C having a third width Wc different from a first width Wa and a second width Wb. In example embodiments, the first width Wa may be greater than the second width Wb and the third width Wc, and the third width Wc may be greater than the second width Wb. The transition active pattern 105T connecting the first active pattern 105A to the second active pattern 105B may be disposed between the first active pattern 105A and the second active pattern 105B, and the transition active pattern 105T' connecting the second active pattern 105B to the third active pattern 105C may be disposed between the second active pattern 105B and the third active pattern 105C. The transition active patterns 105T and 105T' may provide an inclined side surface by a portion of which a width in the second direction (e.g., the Y-direction) changes. In the region in which the first active pattern 105A and the gate structures 160 overlap each other vertically, the region in which the second active pattern 105B and the gate structures 160 overlap each other vertically, and the region in which the third active pattern 105C and the gate structures 160 overlap each other vertically, the width Cha of the first channel, the width CHb of the second channel, and the width CHc of the third channel of the channel structure 140 may be constant. In the region in which the transition active patterns 105T and 105T' and the gate structures 160 vertically overlap each other, the channel structure 140 may have the widths CHt and CHt' of the transition channel. The widths CHt and CHt' of the transition channel of channel structure 140 may gradually increase or decrease along the first direction (e.g., the X-direction).

The source/drain regions 150 may further include a third source/drain region 150C on the third active pattern 105C. The first width Wa of the first active pattern 105A, the second width Wb of the second active pattern 105B, and the third width Wc of the third active pattern 105C may be different, and the width Cha of the first channel, the width CHb of the second channel, and the width CHc of the third channel are different, the thickness Tc of the third sidewall of the first epitaxial layer 151 of the third source/drain region 150C along the first direction (e.g., the X-direction) may be different from the thickness Ta of the first sidewall and the thickness Tb of the second sidewall. In example embodiments, the thickness Ta of the first sidewall may be greater than the thickness Tb of the second sidewall and the thickness Tc of the third sidewall, and the thickness Tc of the third sidewall may be greater than the thickness Tb of the second sidewall.

The transition source/drain region 150T may be disposed on the transition active pattern 105T connecting the first active pattern 105A to the second active pattern 105B, and the transition source/drain region 150T' may be disposed on the transition active pattern 105T' connecting the second active pattern 105B to the third active pattern 105C.

In example embodiments, at a particular vertical level, the transition source/drain region 150T between the first source/drain region 150A and the second source/drain region 150B may have a thickness Tt1 of the first transition sidewall of the first epitaxial layer 151 of the transition source/drain region 150T along the first direction (e.g., the X-direction) and a thickness Tt2 of the second transition sidewall smaller than the thickness Tt1 of the first transition sidewall, which may be because the width CHa of the first channel may be greater than the width CHb of the second channel. In example embodiments, the thickness Ta of the first sidewall may be substantially equal to the thickness Tt1 of the first transition sidewall, and the thickness Tb of the second sidewall may be substantially equal to the thickness Tt2 of the second transition sidewall, but example embodiments thereof are not limited thereto.

In example embodiments, at a particular vertical level, the transition source/drain region 150T' between the second source/drain region 150B and the third source/drain region 150C may have a thickness Tt1' of the first transition sidewall of the first epitaxial layer 151 of the transition source/drain region 150T' along the first direction (e.g., the X-direction) and a thickness Tt2' of the second transition sidewall, which is greater than the thickness Tt1' of the first transition sidewall, which may be because the width CHc of the third channel may be greater than the width CHb of the second channel. In example embodiments, the thickness Tb of the second sidewall may be substantially the same as the thickness Tt1' of the first transition sidewall, and the thickness Tc of the third sidewall may be substantially the same as the thickness Tt2' of the second transition sidewall, but example embodiments thereof is not limited thereto.

In example embodiments, at a particular vertical level, the width Pt of the second epitaxial layer 152 of the transition source/drain region 150T in the first direction (e.g., the X-direction), disposed between the first source/drain region 150A and the second source/drain region 150B, may be greater than a width Pa of the second epitaxial layer 152 of the first source/drain region 150A along the first direction (e.g., the X-direction), and may be smaller than a width Pb of the second epitaxial layer 152 of the second source/drain region 150B along the first direction (e.g., the X-direction).

In example embodiments, at a particular vertical level, the width Pt' of the second epitaxial layer 152 of the transition source/drain region 150T' in the first direction (e.g., the X-direction), disposed between the second source/drain region 150B and the third source/drain region 150C, may be smaller than a width Pb of the second epitaxial layer 152 of the second source/drain region 150B in the first direction (e.g., the X-direction), and may be larger than the width Pc along the first direction (e.g., the X-direction) of the second epitaxial layer 152 of the third source/drain region 150C.

In example embodiments, on a cross-sectional surface in the first direction (e.g., the X-direction, as viewed from the Y-direction), a level Lt of a lowermost end of the second epitaxial layer 152 of the transition source/drain region 150T disposed between the first source/drain region 150A and the second source/drain region 150B may be may be higher than a level La of a lowermost end of the second epitaxial layer 152 of the first source/drain region 150A and lower than a level Lb of a lowermost end of the second epitaxial layer 152 of the second source/drain region 150B.

In example embodiments, on a cross-sectional surface in the first direction (e.g., the X-direction), a Level Lt' of a lowermost end of the second epitaxial layer 152 of the transition source/drain region 150T' disposed between the second source/drain region 150B and the third source/drain region 150C may be may be higher than a level Lc of a lowermost end of the second epitaxial layer 152 of the third source/drain region 150C and lower than a level Lb of a lowermost end of the second epitaxial layer 152 of the second source/drain region 150B.

In FIG. 6B, the level Lc of the lowermost end of the second epitaxial layer 152 of the third source/drain region 150C and the level Lt of the lowermost end of the second epitaxial layer 152 of the transition source/drain region 150T disposed between the first source/drain region 150A and the second source/drain region 150B may be the same, but an example embodiment thereof is not limited thereto.

In example embodiments, on a cross-sectional surface in the first direction (e.g., the X-direction, as viewed from the Y-direction), a thickness Dt from a lowermost end of the first epitaxial layer 151 of the transition source/drain region 150T disposed between the first source/drain region 150A and the second source/drain region 150B to a lowermost end of the second epitaxial layer 152 of the transition source/drain region 150T may be greater than a thickness Da from a lowermost end of the first epitaxial layer 151 of the first source/drain region 150A to a lowermost end of the second epitaxial layer 152 of the first source/drain region 150A and may be smaller than a thickness Db from a lowermost end of the first epitaxial layer 151 of the second source/drain region 150B to a lowermost end of the second epitaxial layer 152 of the second source/drain region 150B.

In example embodiments, on a cross-sectional surface in the first direction (e.g., the X-direction, as viewed from the Y-direction), the thickness Dt' from a lowermost end of the first epitaxial layer 151 of transition source/drain region 150T' disposed between the second source/drain region 150B and the third source/drain region 150C to a lowermost end of the second epitaxial layer 152 of the transition source/drain region 150T' may be greater than a thickness Dc from a lowermost end of the first epitaxial layer 151 of the third source/drain region 150C to a lowermost end of the second epitaxial layer 152 of the third source/drain region 150C, and may be smaller than a thickness Db from a lowermost end of the first epitaxial layer 151 of the second source/drain region 150B to a lowermost end of the second epitaxial layer 152 of the second source/drain region 150B.

In FIG. 6B, a thickness Dt from a lowermost end of the first epitaxial layer 151 of the transition source/drain region 150T to a lowermost end of second epitaxial layer 152 of transition source/drain region 150T disposed between the first source/drain region 150A and the second source/drain region 150B may be the same as the thickness Dc from the lowermost end of the first epitaxial layer 151 of the third source/drain region 150C to the lowermost end of the second epitaxial layer 152 of the third source/drain region 150C.

In the description of the example embodiment below, descriptions overlapping those described above with reference to FIGS. 6A and 6B will not be provided.

Figure 7A:
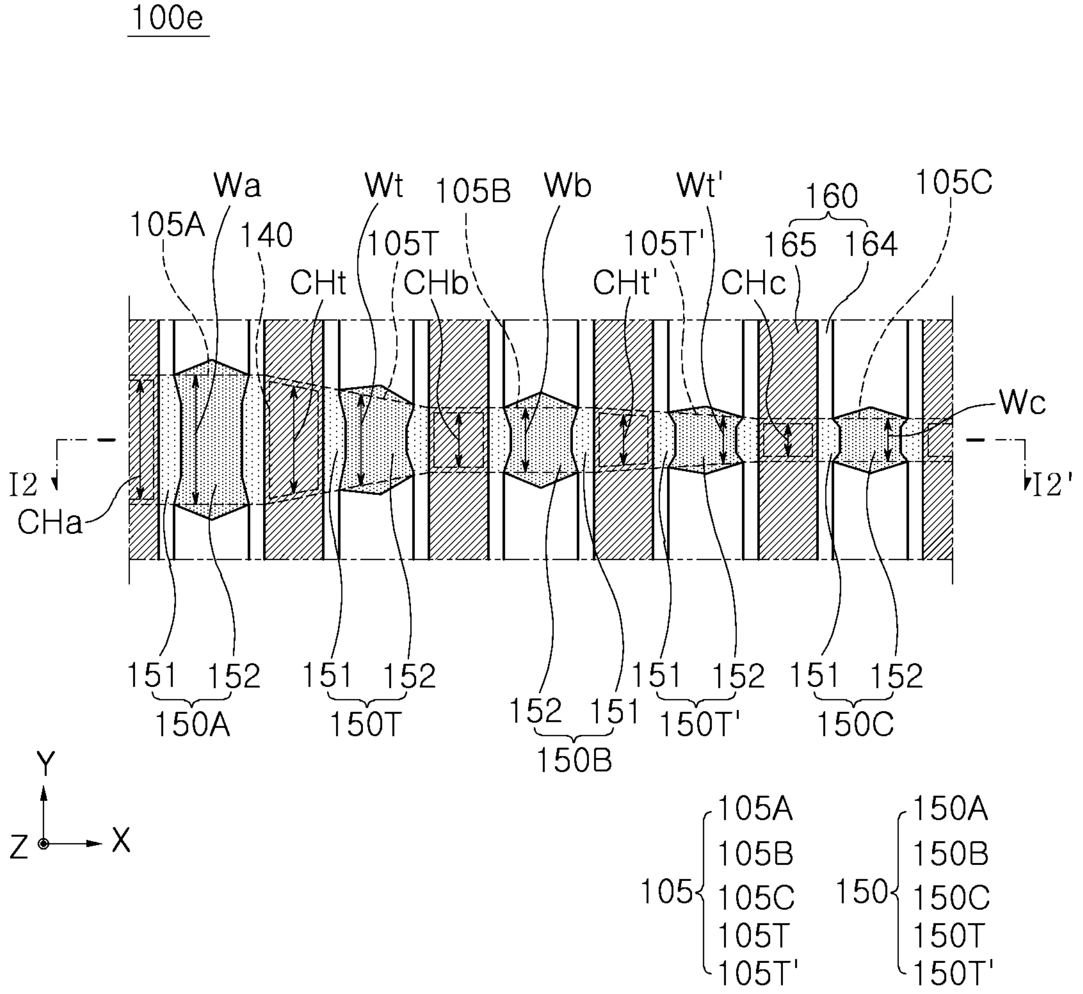
FIG. 7A is a plan diagram illustrating a semiconductor device according to an example embodiment of the present disclosure.

FIG. 7A is a plan diagram illustrating a semiconductor device according to an example embodiment.

Figure 7B:
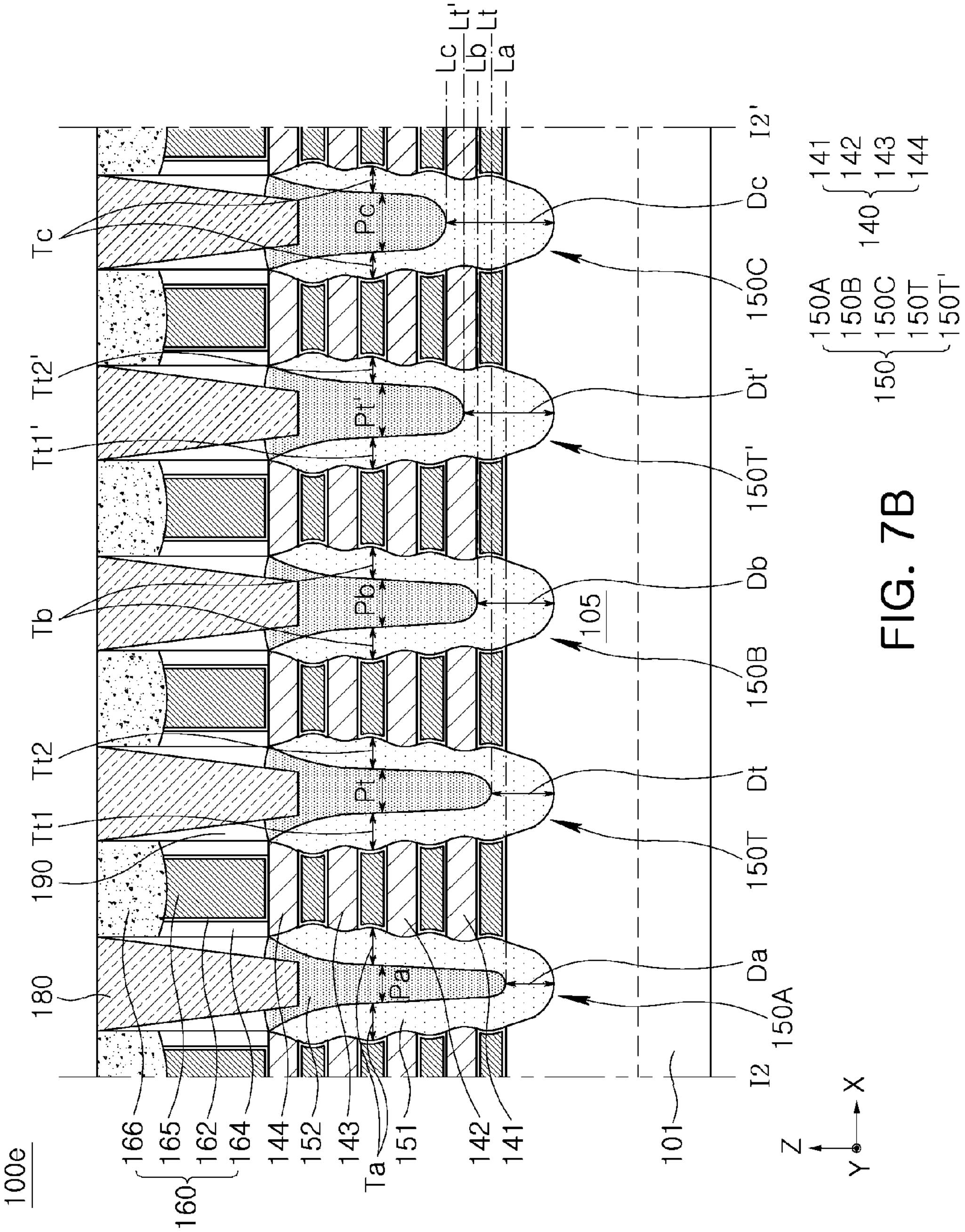
FIG. 7B is a plan diagram illustrating a semiconductor device according to an example embodiment of the present disclosure.

FIG. 7B is a plan diagram illustrating a semiconductor device according to an example embodiment, taken along line 12-12' in FIG. 7A.

Referring to FIGS. 7A and 7B, in a semiconductor device **100*e*, the active region 105 may further include a third active pattern 105C having a third width Wc different from a first width Wa and a second width Wb. In example embodiments, the first width Wa may be greater than the second width Wb, and the second width Wb may be greater than the third width Wc. The transition active pattern 105T connecting the first active pattern 105A to the second active pattern 105B may be disposed between the first active pattern 105A and the second active pattern 105B, and the transition active pattern 105T' connecting the second active pattern 105B to the third active pattern 105C may be disposed between the second active pattern 105B and the third active pattern 105**C.

The source/drain regions 150 may further include a third source/drain region 150C on the third active pattern 105C. The thickness Tc of the third sidewall of the first epitaxial layer 151 of the third source/drain region 150C in the first direction (e.g., the X-direction) may be different from the thickness Ta of the first sidewall and the thickness Tb of the second sidewall. In example embodiments, the thickness Ta of the first sidewall may be greater than the thickness Tb of the second sidewall and the thickness Tc of the third sidewall, and the thickness Tb of the second sidewall may be greater than the thickness Tc of the third sidewall.

In example embodiments, at a particular vertical level, the transition source/drain region 150T disposed between the first source/drain region 150A and the second source/drain region 150B may have a thickness Tt1 of the first transition sidewall of the first epitaxial layer 151 of the transition source/drain region 150T along the first direction (e.g., the X-direction) and a thickness Tt2 of the second transition sidewall smaller than the thickness Tt1 of the first transition sidewall, which may be because the width CHa of the first channel may be greater than the width CHb of the second channel. In example embodiments, the thickness Ta of the first sidewall may be substantially equal to the thickness Tt1 of the first transition sidewall, and the thickness Tb of the second sidewall may be substantially equal to the thickness Tt2 of the second transition sidewall, but example embodiments thereof is not limited.

In example embodiments, at a particular vertical level, the transition source/drain region 150T' between the second source/drain region 150B and the third source/drain region 150C may have a thickness Tt1' of the first transition sidewall of the first epitaxial layer 151 of the transition source/drain region 150T' along the first direction (e.g., the X-direction) and a thickness Tt2' of the second transition sidewall, smaller than the thickness Tt1' of the first transition sidewall. In example embodiments, the thickness Tb of the second sidewall may be substantially the same as the thickness Tt1' of the first transition sidewall, and the thickness Tc of the third sidewall may be substantially the same as the thickness Tt2' of the second transition sidewall, but example embodiments thereof are not limited thereto.

In example embodiments, at a particular vertical level, the width Pt of the second epitaxial layer 152 of the transition source/drain region 150T in the first direction (e.g., the X-direction), disposed between the first source/drain region 150A and the second source/drain region 150B, may be greater than the width Pa of the second epitaxial layer 152 of the first source/drain region 150A along the first direction (e.g., the X-direction), and may be smaller than the width Pb along the first direction (e.g., the X-direction) of the second epitaxial layer 152 of the second source/drain region 150B.

In example embodiments, at a particular vertical level, the width Pt' of the second epitaxial layer 152 of the transition source/drain region 150T' in the first direction (e.g., the X-direction), disposed between the second source/drain region 150B and the third source/drain region 150C, may be greater than the width Pb of the second epitaxial layer 152 of the second source/drain region 150B along the first direction (e.g., the X-direction), and may be smaller than the width Pc of the second epitaxial layer 152 of the third source/drain region 150C in the first direction (e.g., the X-direction).

In example embodiments, on a cross-sectional surface in the first direction (e.g., the X-direction, as viewed from the Y-direction), a level Lt of a lowermost end of the second epitaxial layer 152 of the transition source/drain region 150T disposed between the first source/drain region 150A and the second source/drain region 150B may be higher than a level La of a lowermost end of the second epitaxial layer 152 of the first source/drain region 150A and may be lower a level Lb of a lowermost end of the second epitaxial layer 152 of the second source/drain region 150B.

In example embodiments, on a cross-sectional surface in the first direction (e.g., the X-direction, as viewed from the Y-direction), a level Lt' of a lowermost end of the second epitaxial layer 152 of the transition source/drain region 150T' disposed between the second source/drain region 150B and the third source/drain region 150C may be higher than a level Lb of a lowermost end of the second epitaxial layer 152 of the second source/drain region 150B and may be lower than a level Lc of a lowermost end of the second epitaxial layer 152 of the third source/drain region 150C.

In example embodiments, on a cross-sectional surface in the first direction (e.g., the X-direction, as viewed from the Y-direction), a thickness Dt from a lowermost end of the first epitaxial layer 151 of transition source/drain region 150T to a lowermost end of the second epitaxial layer 152 of transition source/drain region 150T disposed between the first source/drain region 150A and the second source/drain region 150B may be greater than a thickness Da from a lowermost end of the first epitaxial layer 151 of the first source/drain region 150A to a lowermost end of the second epitaxial layer 152 of the first source/drain region 150A, and may be smaller than a thickness Db from a lowermost end of the first epitaxial layer 151 of the second source/drain region 150B to a lowermost end of the second epitaxial layer 152 of the second source/drain region 150B.

In example embodiments, on a cross-sectional surface in the first direction (e.g., the X-direction, as viewed from the Y-direction), a thickness Dt' from a lowermost end of the first epitaxial layer 151 of transition source/drain region 150T' to a lowermost end of the second epitaxial layer 152 of transition source/drain region 150T', disposed between second source/drain region 150B and third source/drain region 150C, may be greater than a thickness Db from the lowermost end of the first epitaxial layer 151 of the second source/drain region 150B to the lowermost end of the second epitaxial layer 152 of the second source/drain region 150B and may be smaller than a thickness Dc from the lowermost end of the first epitaxial layer 151 of the third source/drain region 150C to the lowermost end of the second epitaxial layer 152 of the third source/drain region 150C.

Figure 8:
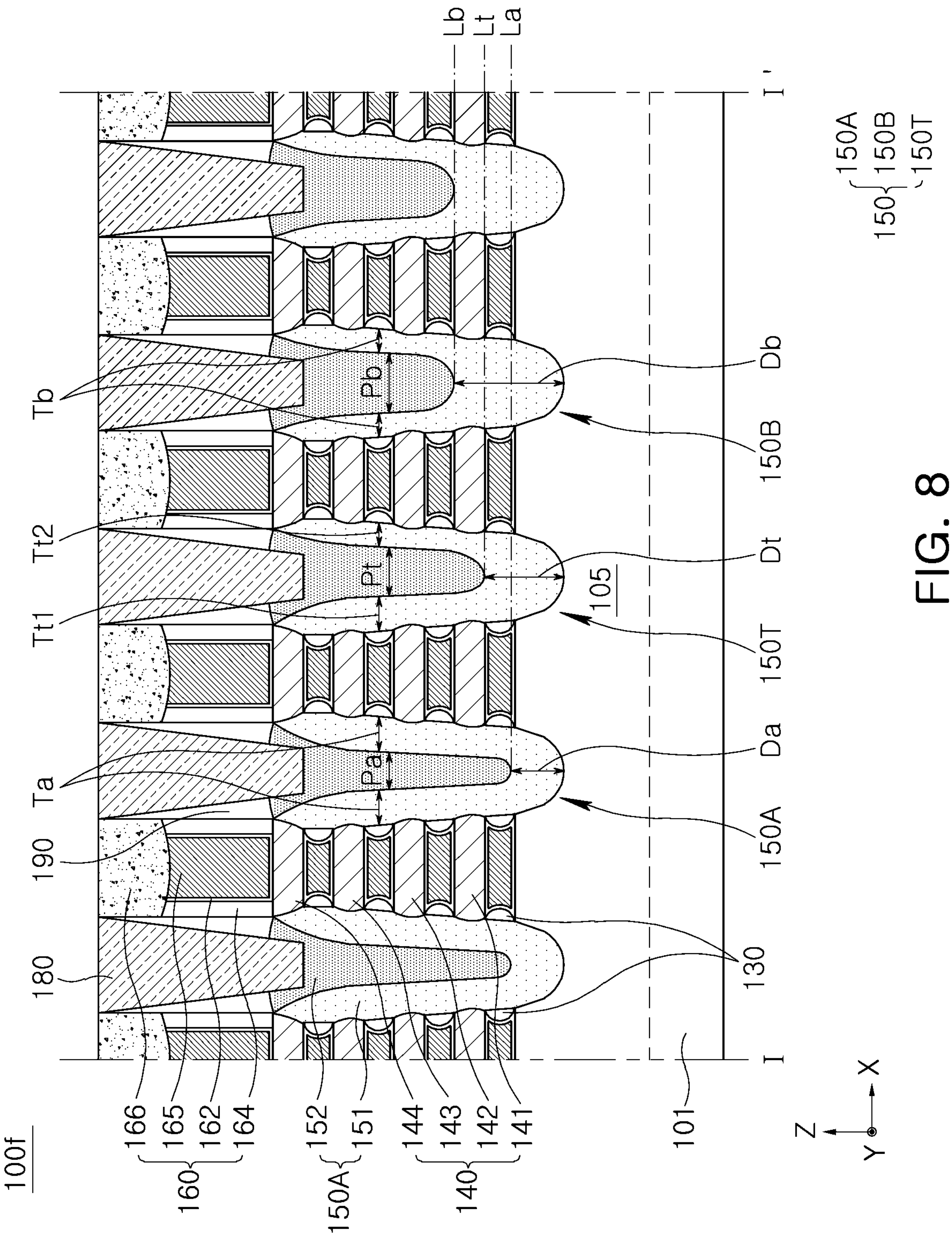
FIG. 8 is a plan diagram illustrating a semiconductor device according to an example embodiment of the present disclosure.

FIG. 8 is a plan diagram illustrating a semiconductor device according to an example embodiment.

Referring to FIG. 8, a semiconductor device 100*c* may further include internal spacer layers 130 disposed on both side surfaces of the gate structures 160 in the X-direction below the fourth channel layers 144.

The internal spacer layers 130 may be disposed in parallel with the gate electrodes 165 and the gate dielectric layers 162 between the first to fourth channel layers 141, 142, 143, and 144 in the third direction (e.g., Z-direction). The side surface of the internal spacer layers 130 may be in contact with the source/drain region 150. The gate electrodes 165 may be stably spaced apart from and may be electrically isolated from the source/drain regions 150 by the internal spacer layers 130. The internal spacer layers 130 may have a shape in which a side surface opposing the gate electrodes 165 may have an inwardly rounded shape, rounded toward the gate electrodes 165 (e.g., to have a convex surface facing the gate electrodes 165), but an example embodiment thereof is not limited thereto. The internal spacer layers 130 may be formed of oxide, nitride and oxynitride, and for example, may be formed of a low-K film.

In some example embodiments, the internal spacer layers 130 may be applied only to a portion of devices of the semiconductor device 100*c*. For example, in an nFET, the internal spacer layers 130 may be applied, and in a pFET, the internal spacer layer 130 may not be provided to improve crystallinity of silicon germanium (SiGe) in the source/drain regions 150.

FIGS. 9A to 16 are diagrams illustrating a method of manufacturing a semiconductor device according to an example embodiment, illustrating an example embodiment of a method of manufacturing the semiconductor device in FIGS. 2A to 2C. FIGS. 9A, 10A, 11A, 12A, 13A, 14A, 15A, and 16 illustrate cross-sectional surfaces corresponding to FIG. 2A, FIGS. 9B, 10B, 11B, and 15B illustrate cross-sectional surfaces corresponding to FIG. 2B, and FIGS. 9C, 10C, 12B, 13B, 14B, and 15C illustrate cross-sectional surfaces corresponding to FIG. 2C.

Figure 9A:
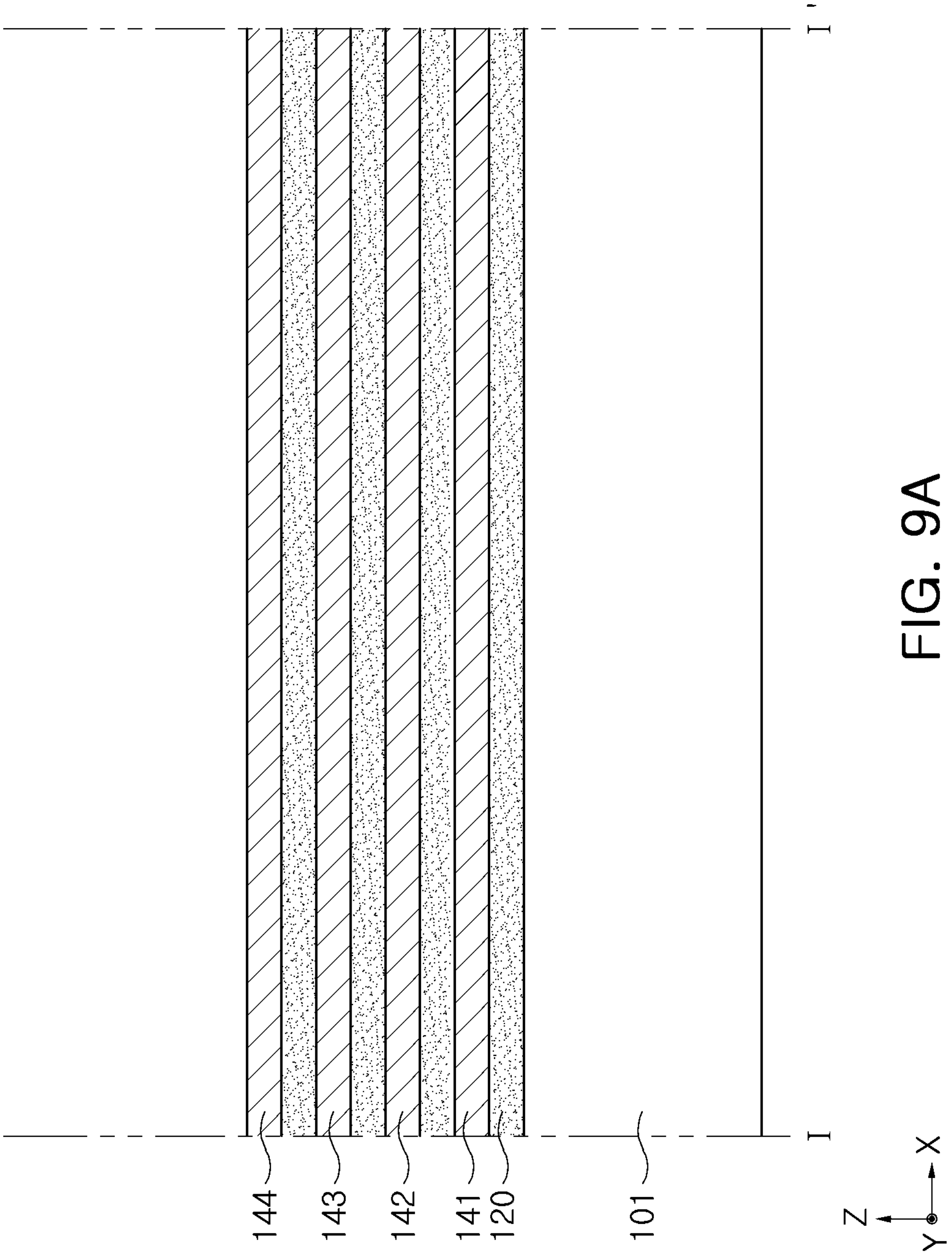
FIGS. 9A-9C, 10A-10C, 11A-11B, 12A-12B, 13A-13B, 14A-14B, 15A-15C, and 16 are diagrams illustrating a method of manufacturing a semiconductor device according to an example embodiment of the present disclosure.
Figure 9B:
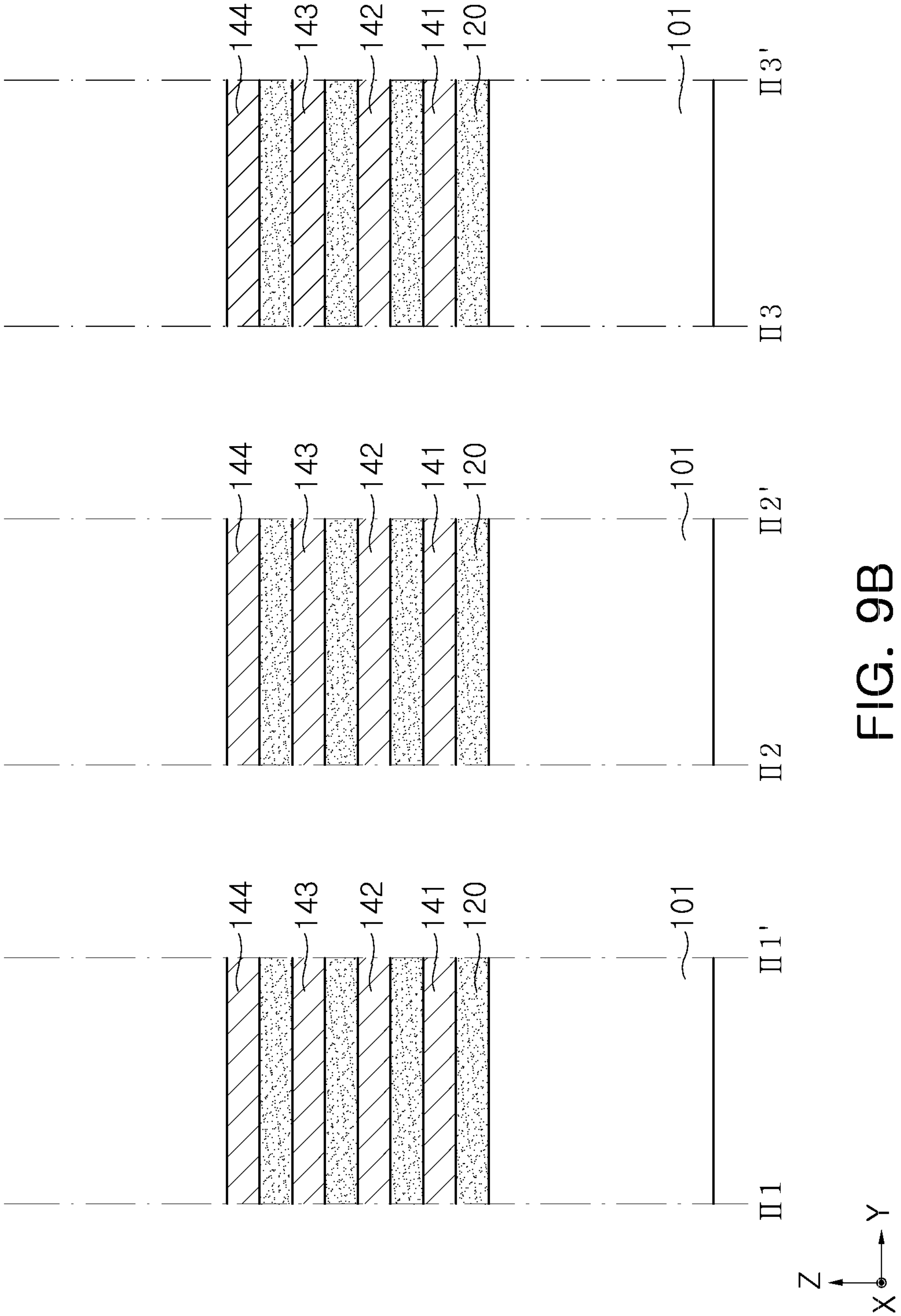
Figure 9C:
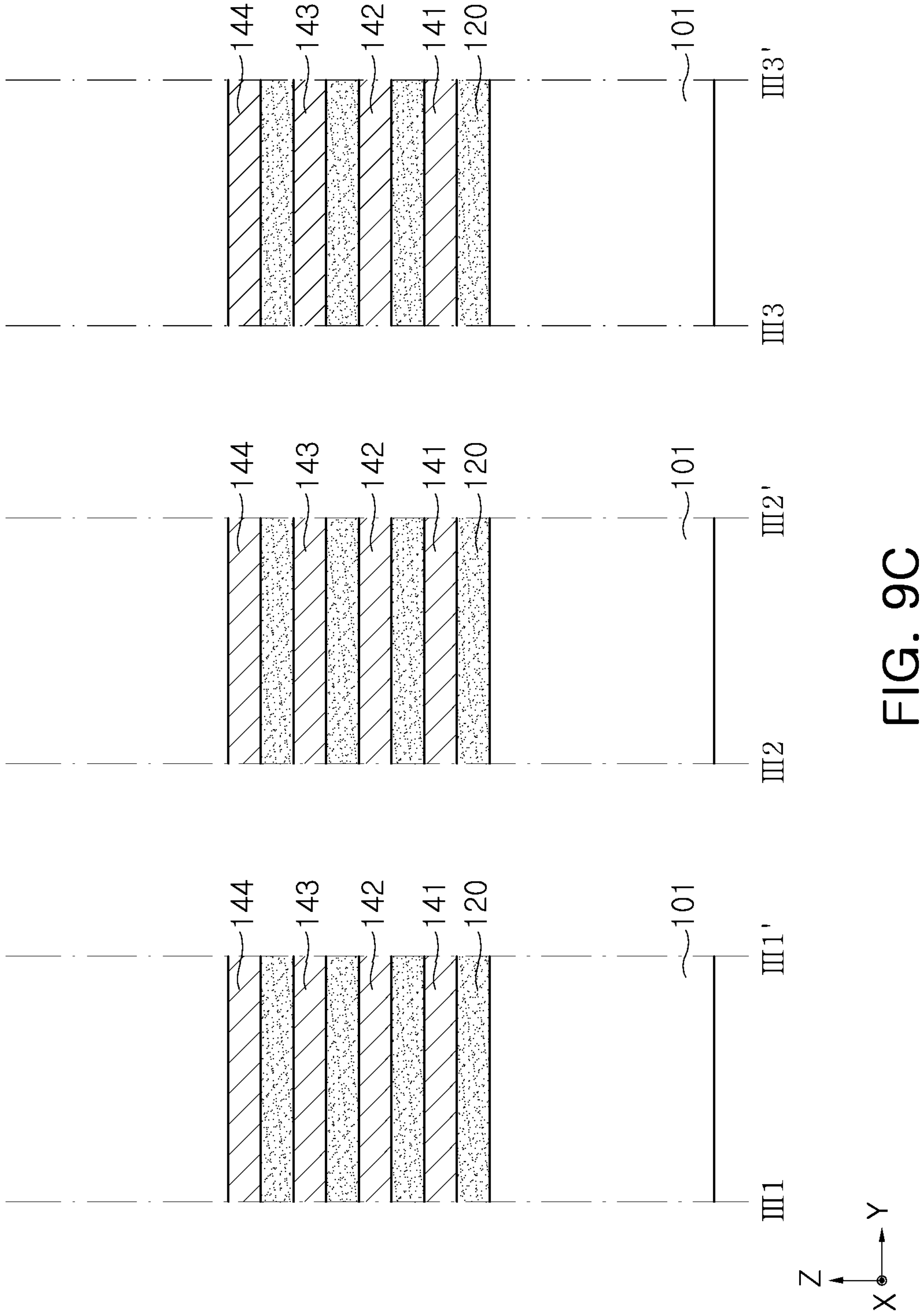

Referring to FIGS. 9A to 9C, the sacrificial layers 120 and the first to fourth channel layers 141, 142, 143, and 144 may be alternately stacked on the substrate 101.

The sacrificial layers 120 may be replaced with the gate dielectric layers 162 and the gate electrodes 165 disposed below the fourth channel layer 144 through a subsequent process, as illustrated in FIG. 2A. The sacrificial layers 120 may be formed of a material having etch selectivity with respect to the first to fourth channel layers 141, 142, 143, and 144, respectively. The first to fourth channel layers 141, 142, 143, and 144 may include or be formed of a material different from that of the sacrificial layers 120. The sacrificial layers 120 and the first to fourth channel layers 141, 142, 143, and 144 may include or be formed of, for example, a semiconductor material including at least one of silicon (Si), silicon germanium (SiGe), and germanium (Ge), and may include different materials and may or may not include impurities. For example, the sacrificial layers 120 may be silicon germanium (SiGe), and the first to fourth channel layers 141, 142, 143, and 144 may be silicon (Si).

The sacrificial layers 120 and the first to fourth channel layers 141, 142, 143, and 144 may be formed by performing an epitaxial growth process from the stacked structure. Each of the sacrificial layers 120 and the first to fourth channel layers 141, 142, 143, and 144 may have a thickness ranging from about 1 nm to about 20 nm. The number of sacrificial layers 120 and the number of channel layers alternately stacked may vary in example embodiments.

Figure 10A:
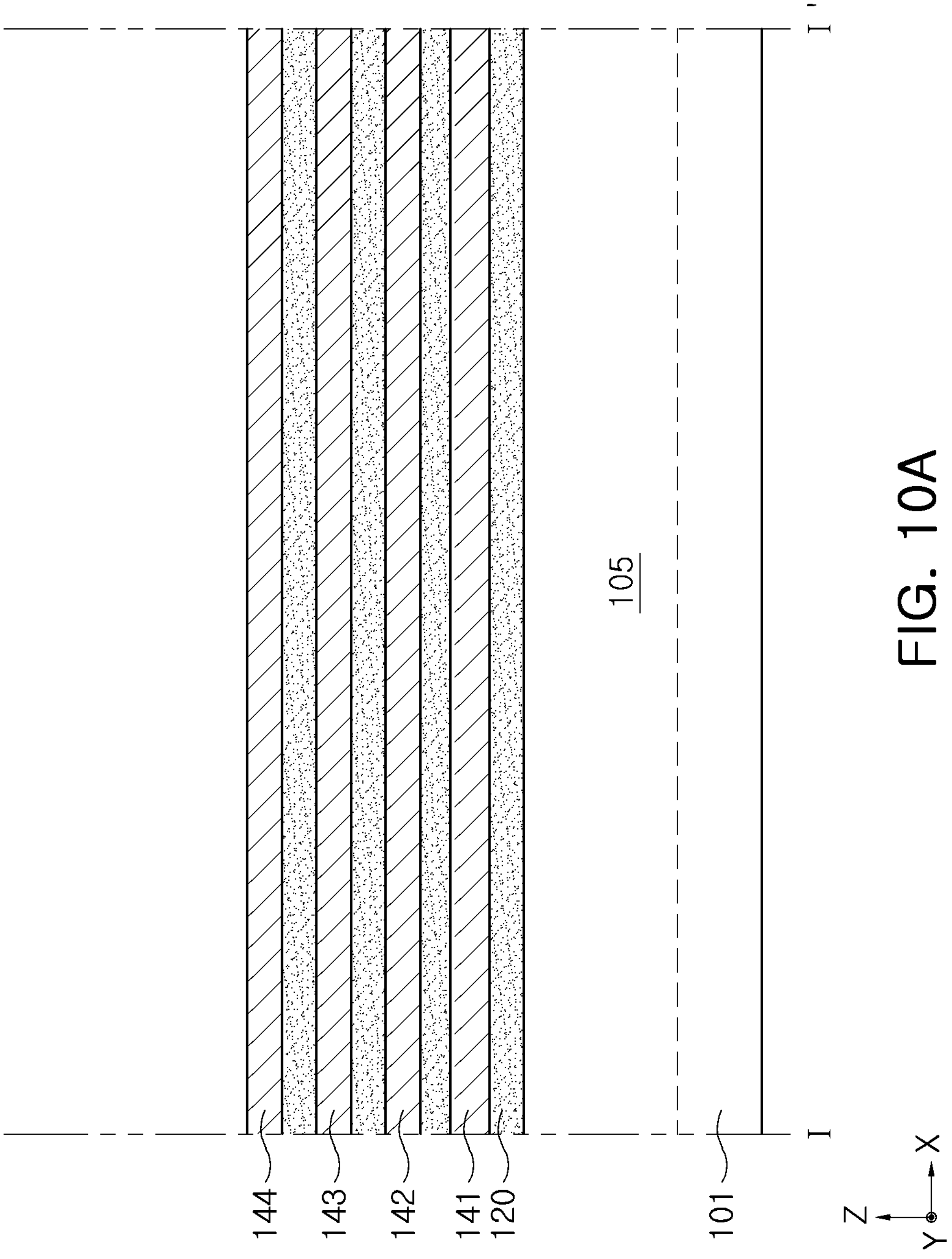
Figure 10B:
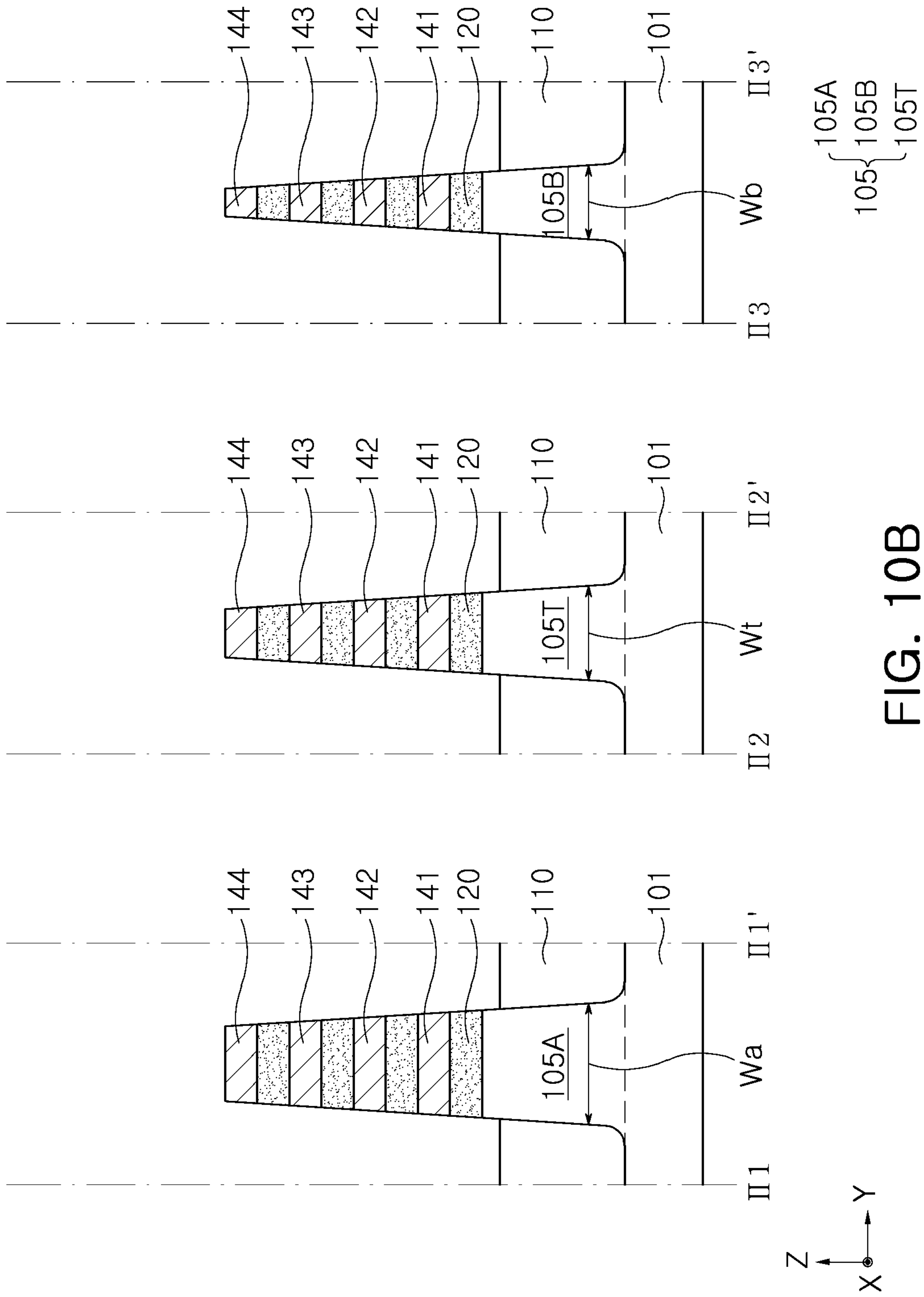
Figure 10C:

Referring to FIGS. 10A to 10C, an active structure including the active region 105 may be formed by partially removing the sacrificial layers 120, the first to fourth channel layers 141, 142, 143, and 144, and substrate 101, and the device isolation layer 110 may be formed.

The active structure may include the active region 105, the sacrificial layers 120, and the first to fourth channel layers 141, 142, 143, and 144. The active structure may be formed in the form of a line extending in one direction, for example, the X-direction, and may be spaced apart from adjacent active structures in the Y-direction. The active region 105, the sacrificial layers 120, and the first to fourth channel layers 141 to 141 may be sequentially stacked in the vertical direction (the Z-direction). The width of the active structure in the second direction (the Y-direction) may gradually narrow along the vertical direction (the Z-direction).

An insulating material may be filled in the regions from which a portion of each of the active region 105, the sacrificial layers 120, and the first to fourth channel layers 141, 142, 143, and 144 are removed, and the device isolation layer 110 may be formed by removing a portion of the insulating material such that the active region 105 may protrude. The upper surface of device isolation layer 110 may be formed on a level lower than a level of the upper surface of active region 105.

When an active structure is formed, a width of the active patterns 105A, 105B, and 105T in the second direction (e.g., the Y-direction) may be formed differently for each region. The active region 105 may include a first active pattern 105A having, at a first vertical level, a first width Wa, a second active pattern 105B having, at the first vertical level, a second width Wb different from the first width Wa, and a transition active pattern 105T connecting the first active pattern 105A to the second active pattern 105B. Since the transition active pattern 105T connects the first active pattern 105A to the second active pattern 105B, which have different widths, the width Wt of the transition active pattern 105T, at the first vertical level, in the second direction (e.g., the Y-direction) may gradually decrease or increase along the first direction (e.g., the X-direction).

Figure 11A:
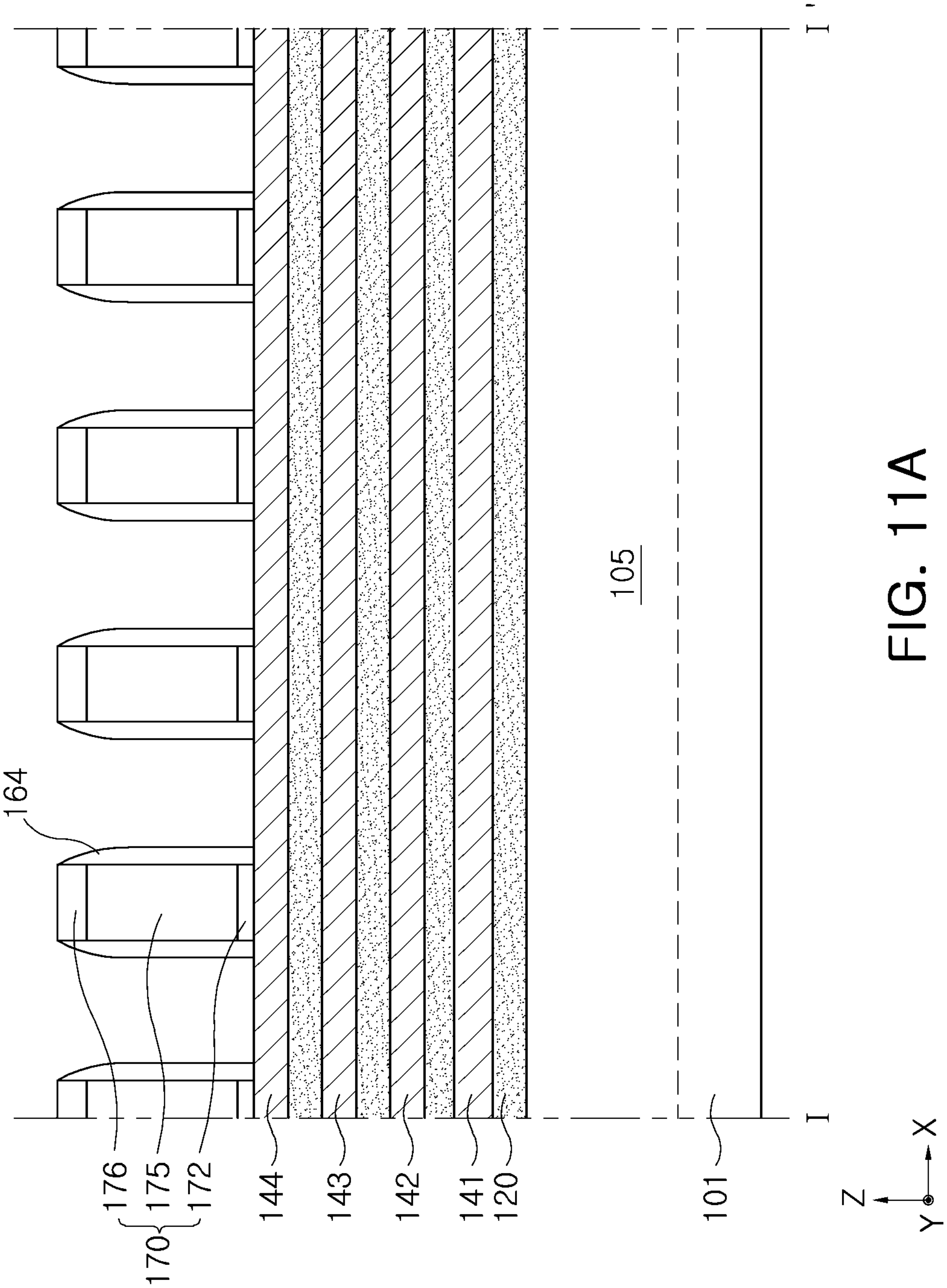
Figure 11B:
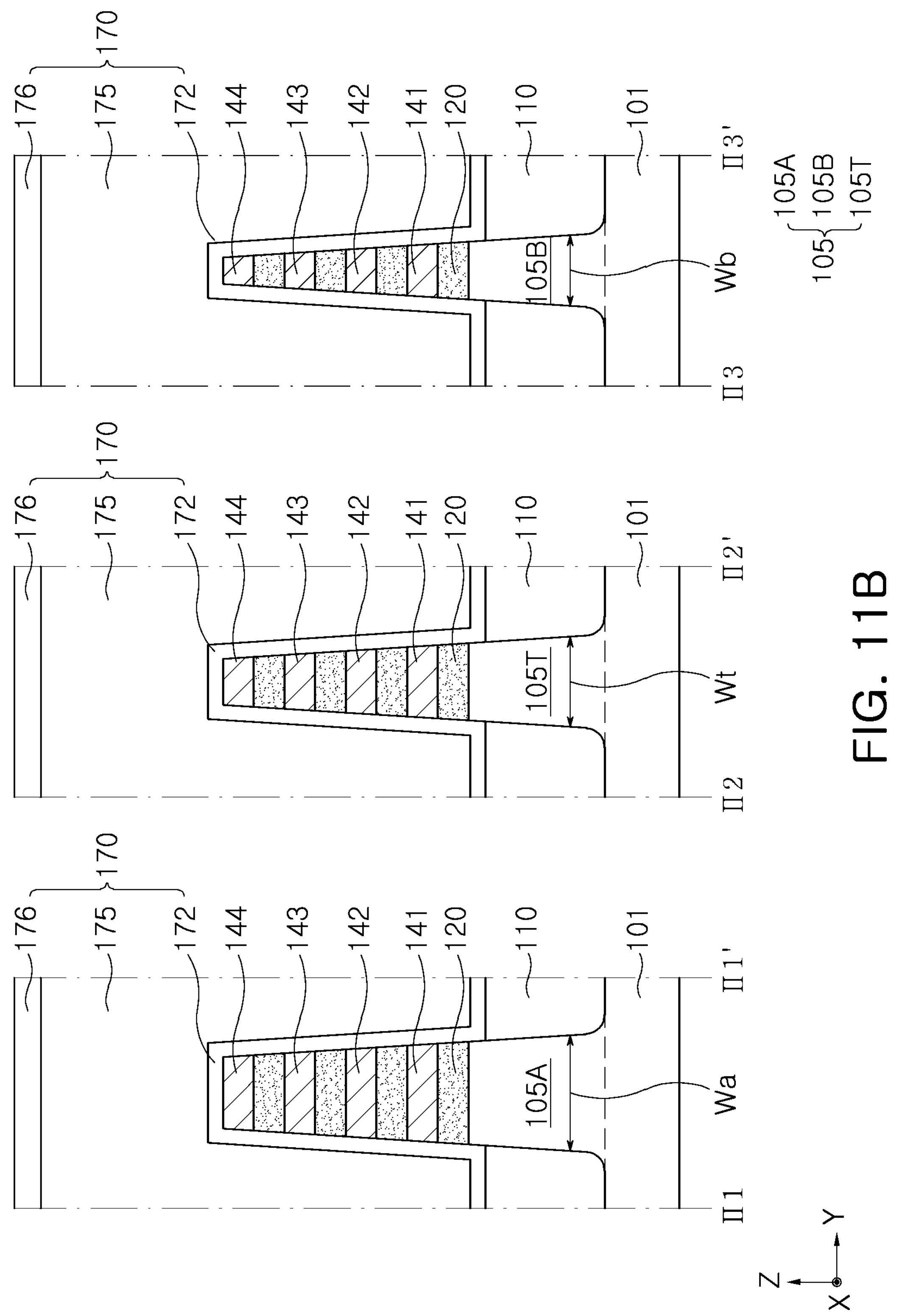

Referring to FIGS. 11A and 11B, the sacrificial gate structures 170 and the gate spacer layers 164 may be formed on the active structure.

The sacrificial gate structures 170 may be configured as dielectric structures formed through a subsequent process in the region in which the gate dielectric layer 162 and the gate electrode 165 are disposed on the first to fourth channel layers 141, 142, 143, and 144, as illustrated in FIG. 2A. The sacrificial gate structures 170 may include first and second sacrificial gate layers 172 and 175, and mask pattern layer 176, which may be stacked in order. The first and second sacrificial gate layers 172 and 175 may be patterned using the mask pattern layer 176. The first and second sacrificial gate layers 172 and 175 may be an insulating layer and a conductive layer, respectively. For example, the first sacrificial gate layer 172 may include or be silicon oxide, and the second sacrificial gate layer 175 may include or be polysilicon. The mask pattern layer 176 may include or be silicon nitride. The sacrificial gate structures 170 may have a line shape extending in one direction and intersecting the active structures. For example, the sacrificial gate structures 170 may extend in the Y-direction and may be spaced apart from each other in the X-direction.

The gate spacer layers 164 may be formed on both (e.g., opposite) sidewalls of sacrificial gate structures 170. The gate spacer layers 164 may be formed by forming a film having a uniform thickness along upper surfaces and side surfaces of the sacrificial gate structures 170 and the active structures, and performing anisotropic etching. The gate spacer layers 164 may be formed of a low-K material and, for example, may include at least one of SiO, SiN, SiCN, SiOC, SiON, and SiOCN.

Figure 12A:
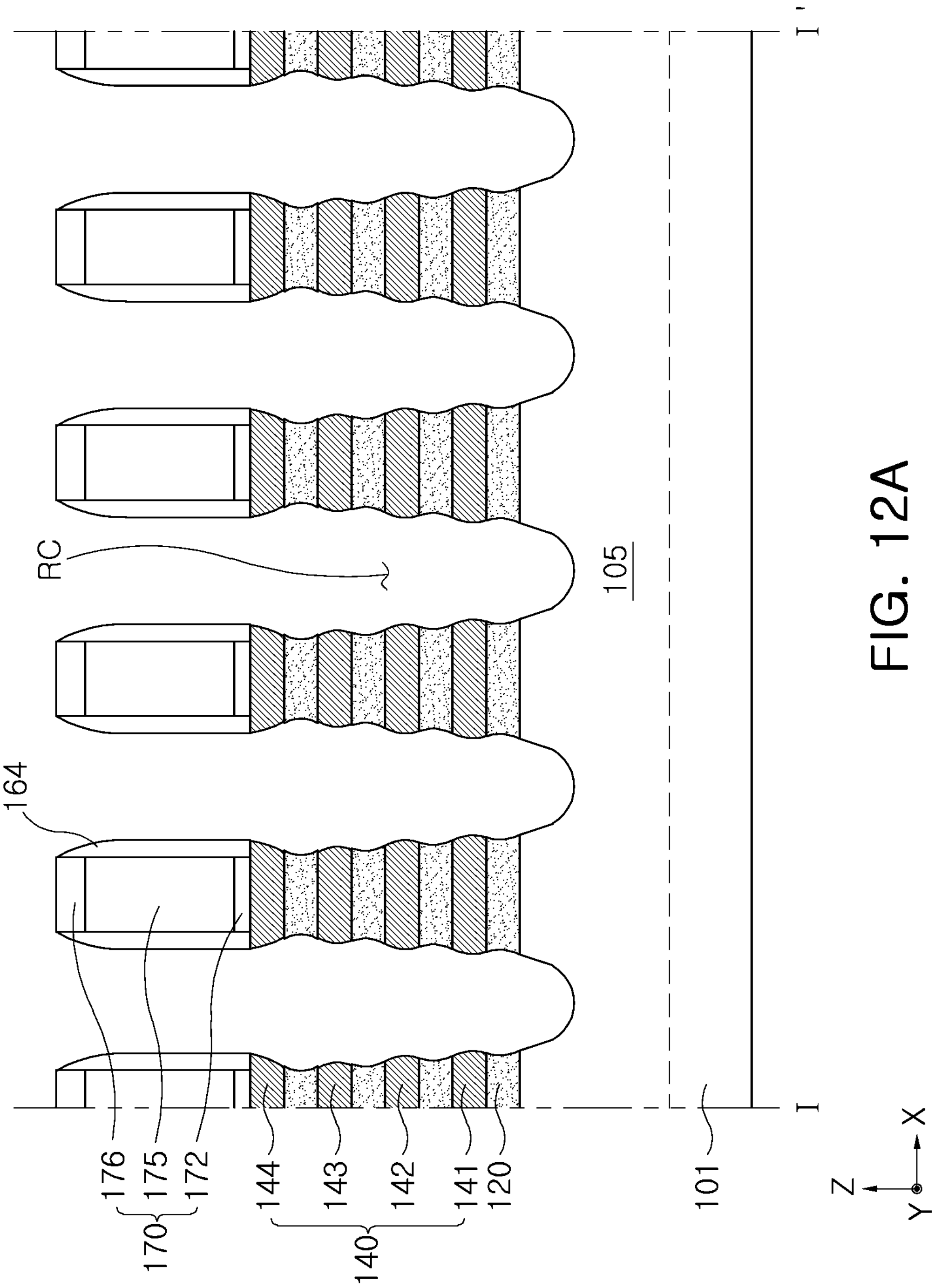
Figure 12B:
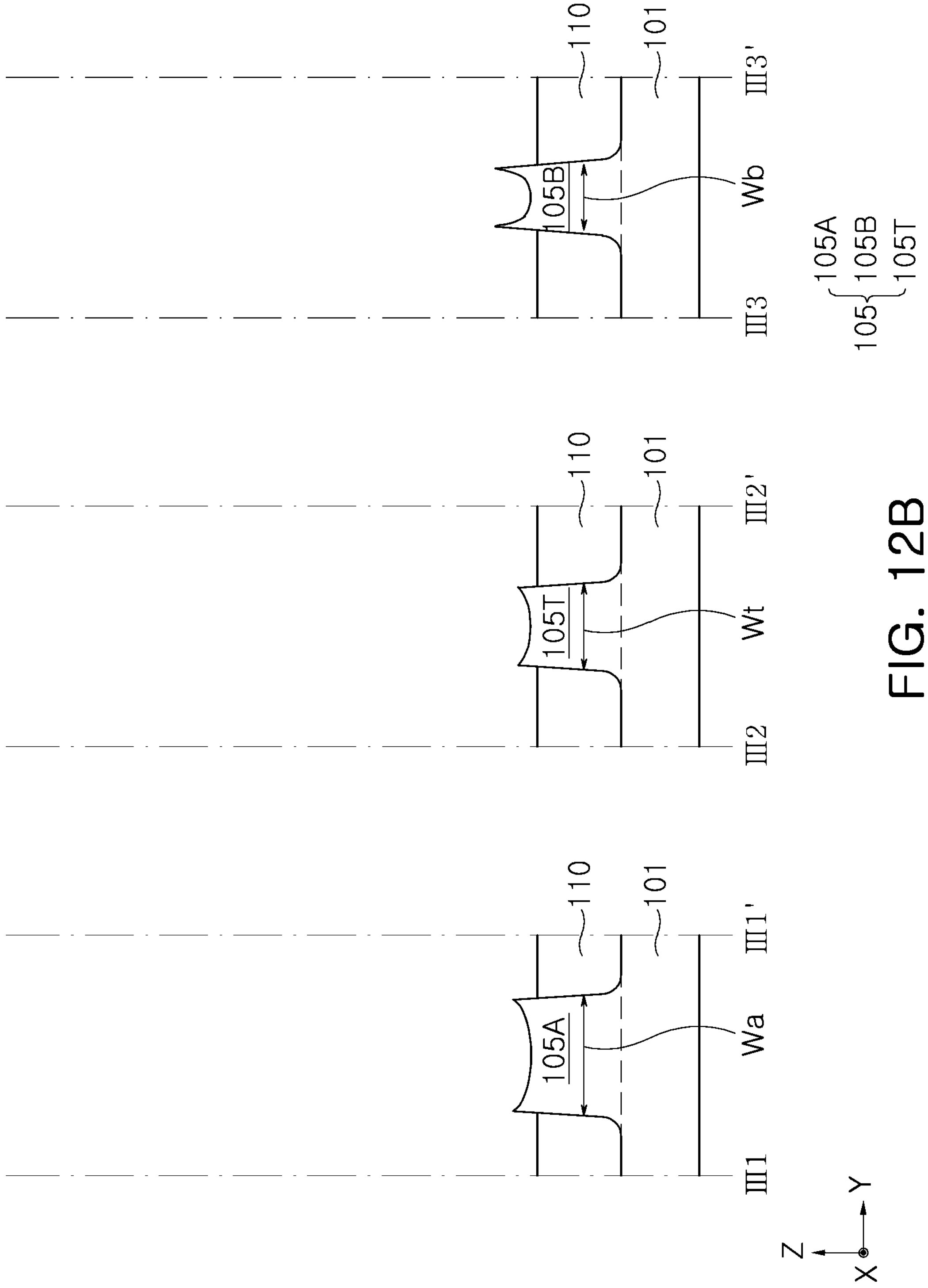

Referring to FIGS. 12A and 12B, recess regions RC may be formed by removing a portion of the sacrificial layers 120 and the first to fourth channel layers 141, 142, 143, and 144 exposed from the sacrificial gate structures 170, and the sacrificial layers 120 may be partially removed.

The recess regions RC may be formed by removing a portion of the exposed sacrificial layers 120 and a portion of first to fourth channel layers 141, 142, 143, and 144 using the sacrificial gate structures 200 and the gate spacer layers 164 as masks. Accordingly, the first to fourth channel layers 141, 142, 143, and 144 may form channel structures 140 having a limited length in the X-direction.

The sacrificial layers 120 may be selectively etched with respect to the channel structures 140 by, for example, a wet etching process and may be removed to a predetermined depth from the side surface in the X-direction. The sacrificial layers 120 may have side surfaces curved inward by etching the side surfaces as described above. However, the specific shape of the side surface of sacrificial layers 120 is not limited to the example illustrated in FIGS. 12A and 12B.

Figure 13A:
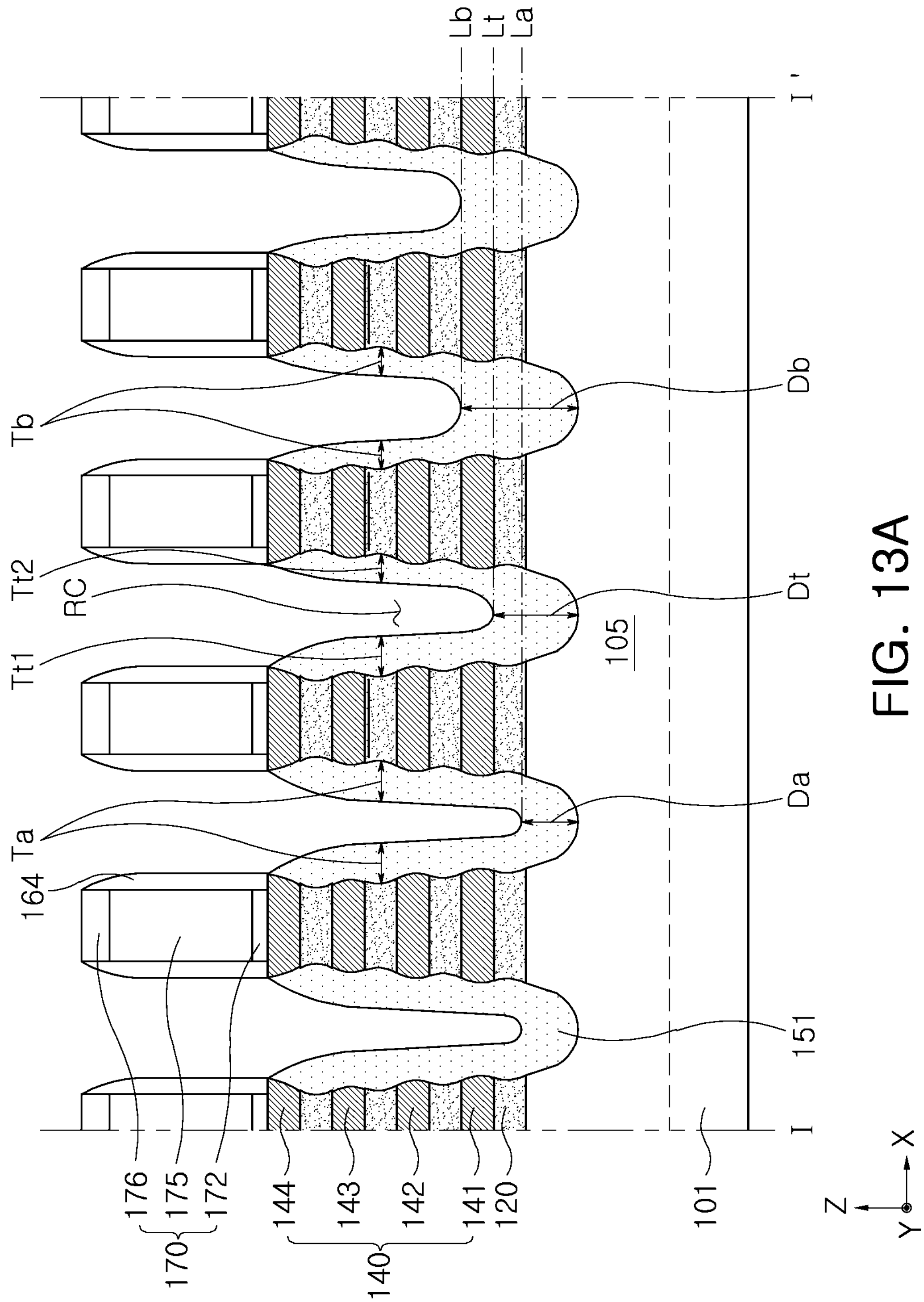
Figure 13B:
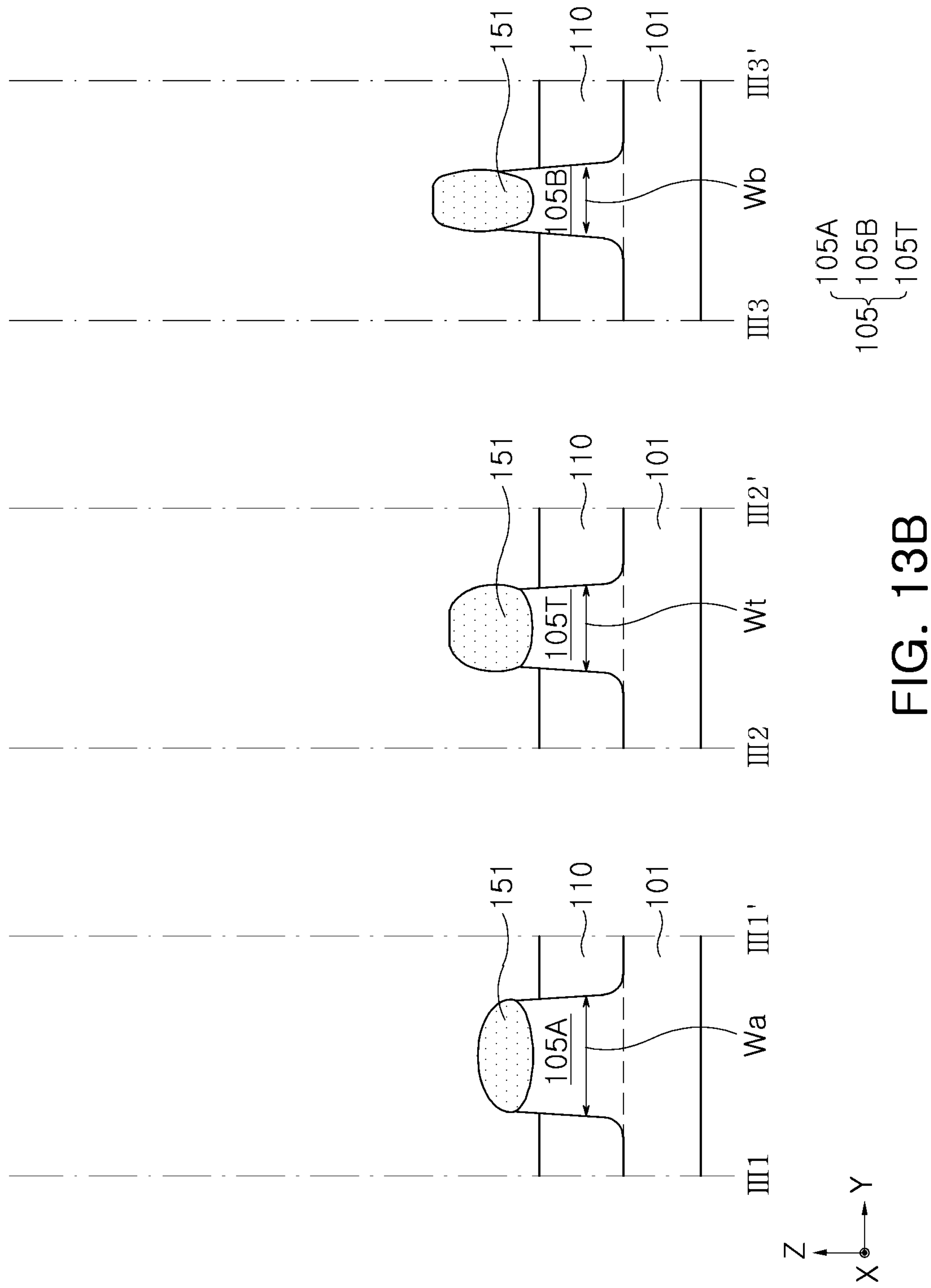

Referring to FIGS. 13A and 13B, the first epitaxial layer 151 may be formed in the recess region RC.

The first epitaxial layer 151 may extend to be in contact with the first to fourth channel layers 141, 142, 143, and 144 and the sacrificial layers 120 in the recess region RC. Accordingly, the upper surface of the first epitaxial layer 151 may be formed in a recessed shape and may be formed to have an almost U-shape. The surface on which the first epitaxial layer 151 is in contact with the first to fourth channel layers 141, 142, 143, and 144 and the sacrificial layers 120 may have a wavy shape. An inner surface of the first epitaxial layer 151 may have a smooth, non-wavy shape.

The first epitaxial layer 151 may include or be formed of silicon germanium (SiGe) doped with a group 3 element. In example embodiment, the first epitaxial layer 151 may include one of boron (B), aluminum (Al), gallium (Ga), indium (In), and thallium (TI). The first epitaxial layer 151 may be formed by supplying silicon (Si) and germanium (Ge) source gas along with supply of carrier gas. In an example embodiment, the carrier gas may be hydrogen ($H_2$) gas, and the silicon (Si) source gas may be, for example, silane ($SiH_4$), dichlorosilane ($SiH_2Cl_2$; DCS), or chlorosilane ($SiH_3Cl$; MCS), and the germanium (Ge) source gas may be, for example, germanium tetrahydride ($GeH_4$). The second epitaxial layer 152 (see FIGS. 14A and 14B), which will be described later, may also be formed in a similar manner.

Since the first epitaxial layer 151 is formed by epitaxial growth from a sidewall and the active region 105 of the plurality of channel layers 141, 142, 143, and 144, the thicknesses of the sidewalls of the first epitaxial layer 151 Ta, Tb, Tt1, Tt2 and the thicknesses Da, Db, and Dt of the lower portion may be different.

The thicknesses Ta, Tb, Tt1, and Tt2 of the sidewalls of the first epitaxial layer 151 may be determined by a width of the plurality of channel layers 141, 142, 143, and 144 in the second direction (e.g., the Y-direction). As illustrated in FIG. 11B, since a width of the plurality of channel layers 141, 142, 143, and 144 in the second direction (e.g., the Y-direction) on the first active pattern 105A may be greater than a width of the plurality of channel layers 141, 142, 143, and 144 on the second active pattern 105B in the second direction (e.g., the Y-direction), the thickness Ta of the first sidewall of the first epitaxial layer 151 of the first source/drain region 150A along the first direction (e.g., the X-direction) may be greater than the thickness Tb of the second sidewall of the first epitaxial layer 151 of the second source/drain region 150B along the first direction (e.g., the X-direction) on one level. The thickness Tt1 of the first transition sidewall of the first epitaxial layer 151 of the transition source/drain region 150T along the first direction (e.g., the X-direction) disposed close to the first source/drain region 150A may be greater than the thickness Tt2 of the second transition sidewall of the first epitaxial layer 151 of the transition source/drain region 150T along the first direction (e.g., the X-direction), disposed close to the second source/drain region 150B.

The thicknesses Da, Db, and Dt of the lower portion of the first epitaxial layer 151 may be affected by the first width Wa of the first active pattern 105A, the second width Wb of the second active pattern 105B, and the width Wt of the transition active pattern 105T in the second direction (e.g., the Y-direction). In example embodiments, on a cross-sectional surface in the first direction (e.g., the X-direction, as viewed from the Y-direction), the thickness Dt of a lower portion of the first epitaxial layer 151 of the transition source/drain region 150T in the vertical direction may be greater than the thickness Da of a lower portion of the first epitaxial layer 151 of the first source/drain region 150A in the vertical direction, and may be smaller than the thickness Db of the lower part of the first epitaxial layer 151 of the second source/drain region 150B in the vertical direction.

The example embodiment in FIG. 8 may be manufactured by forming the internal spacer layers 130 before forming the first epitaxial layer 151 in this process. The internal spacer layers 130 may be formed by filling the region from which the sacrificial layers 120 have been removed with an insulating material and removing the insulating material deposited on an external side of the channel structure 140.

Figure 14A:
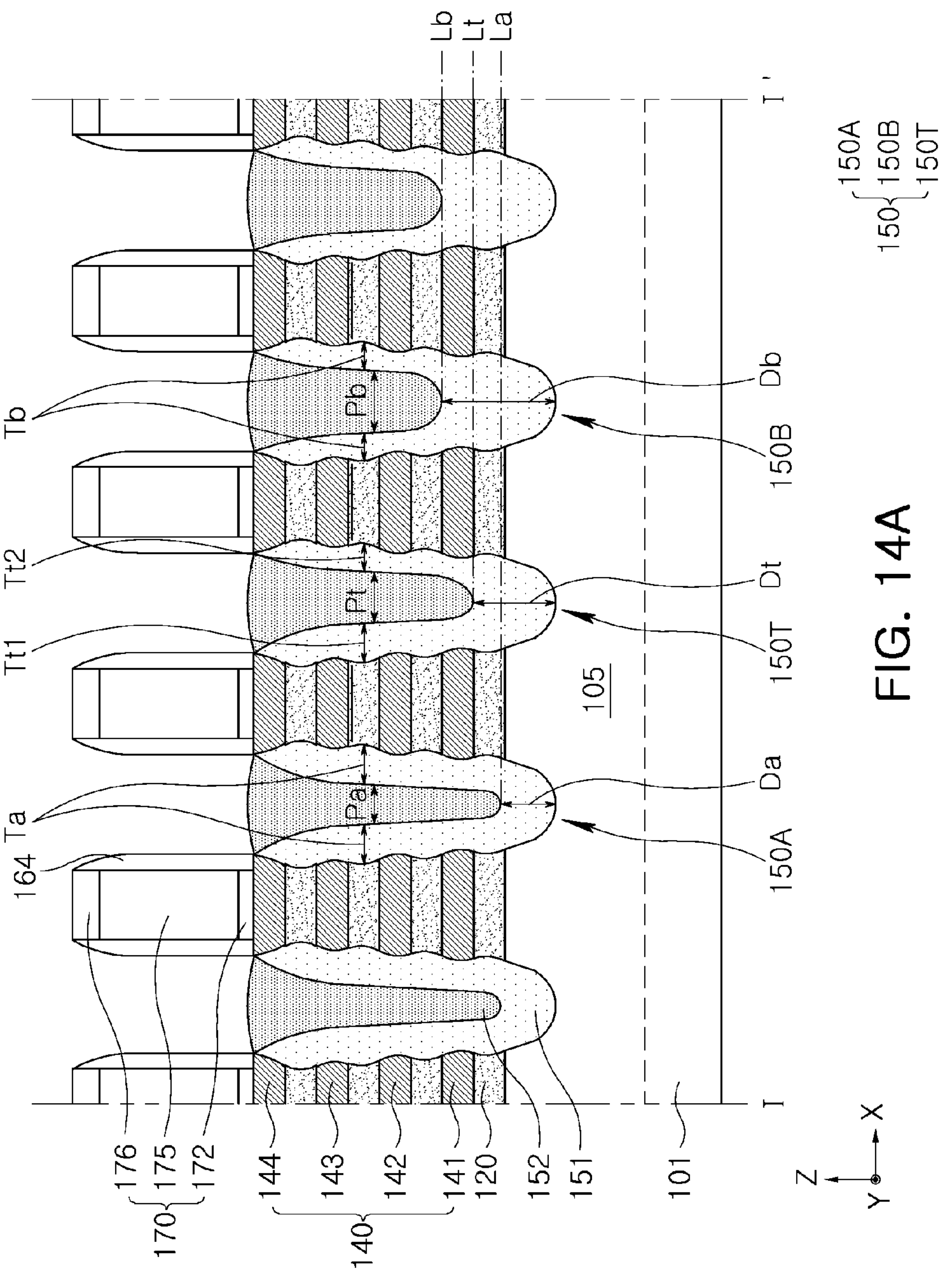
Figure 14B:
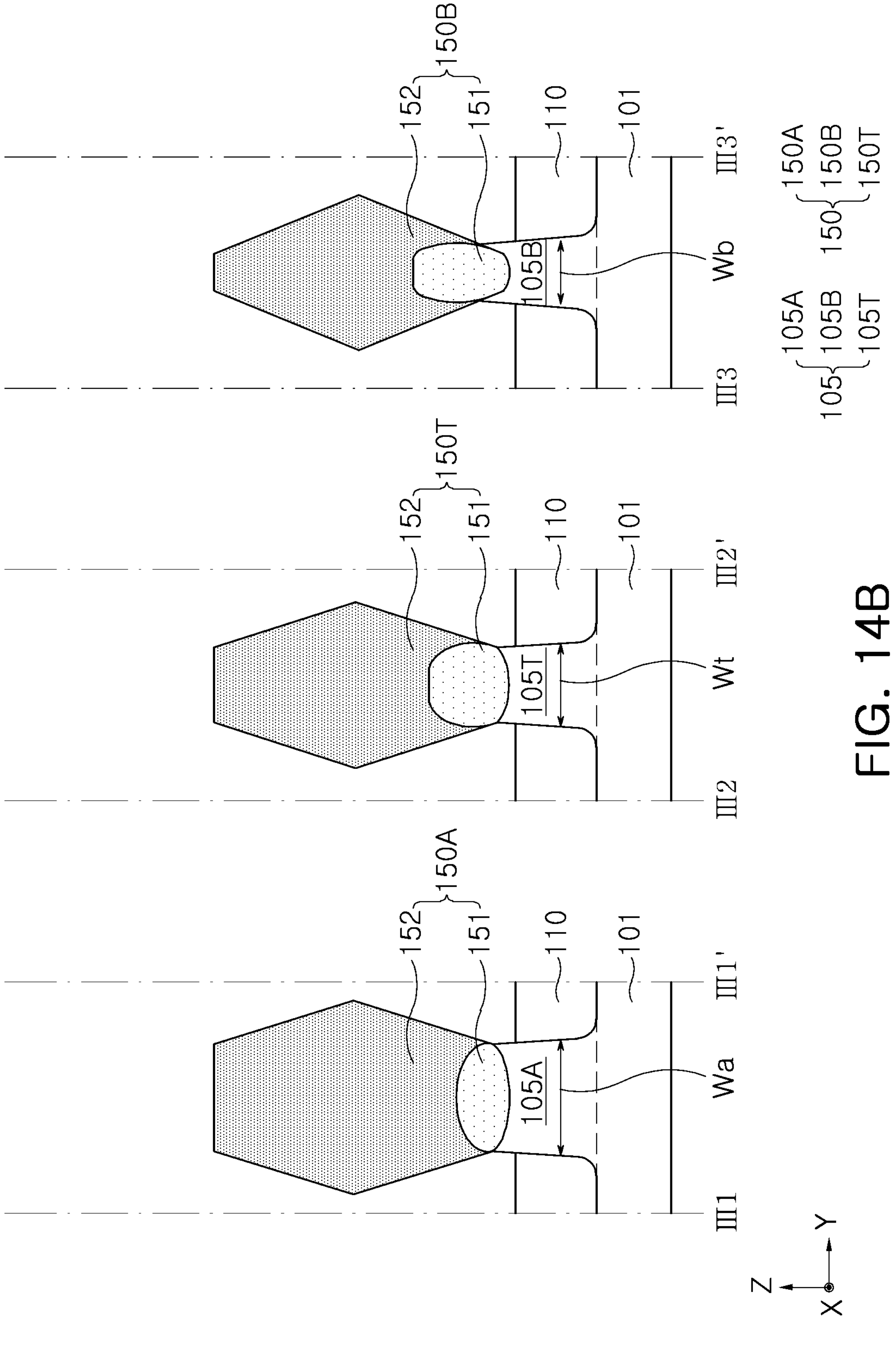

Referring to FIGS. 14A and 14B, the source/drain regions 150 may be formed by forming a second epitaxial layer 152 on the first epitaxial layer 151.

The second epitaxial layer 152 may include or be formed of silicon (Si) doped with a group 3 element. For example, the second epitaxial layer 152 may include one of boron (B), aluminum (Al), gallium (Ga), indium (In), and thallium (TI). The second epitaxial layer 152 may be formed to a level higher than a level of the upper surface of the fourth channel layer 144, but example embodiments thereof are not limited thereto. In example embodiments, a plurality of epitaxial layers may be further formed on the second epitaxial layer 152. The width Pt of the second epitaxial layer 152 of the transition source/drain region 150T in the first direction (e.g., the X-direction) may be greater than the width Pa of the second epitaxial layer 152 of the first source/drain region 150A in the first direction (e.g., the X-direction), and may be smaller than the width Pb of the second epitaxial layer 152 of the second source/drain region 150B in the first direction (e.g., the X-direction).

Figure 15A:
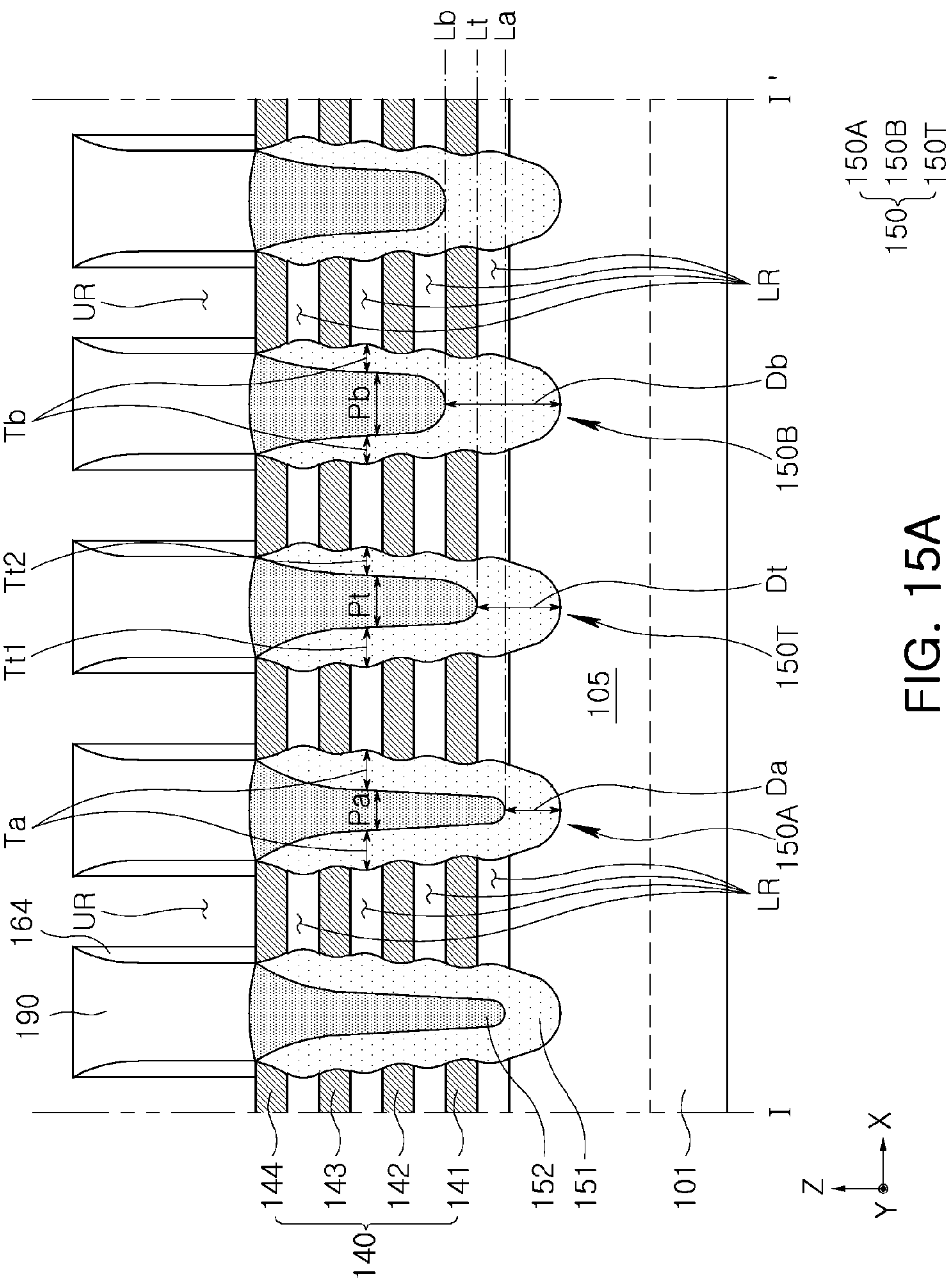
Figure 15B:
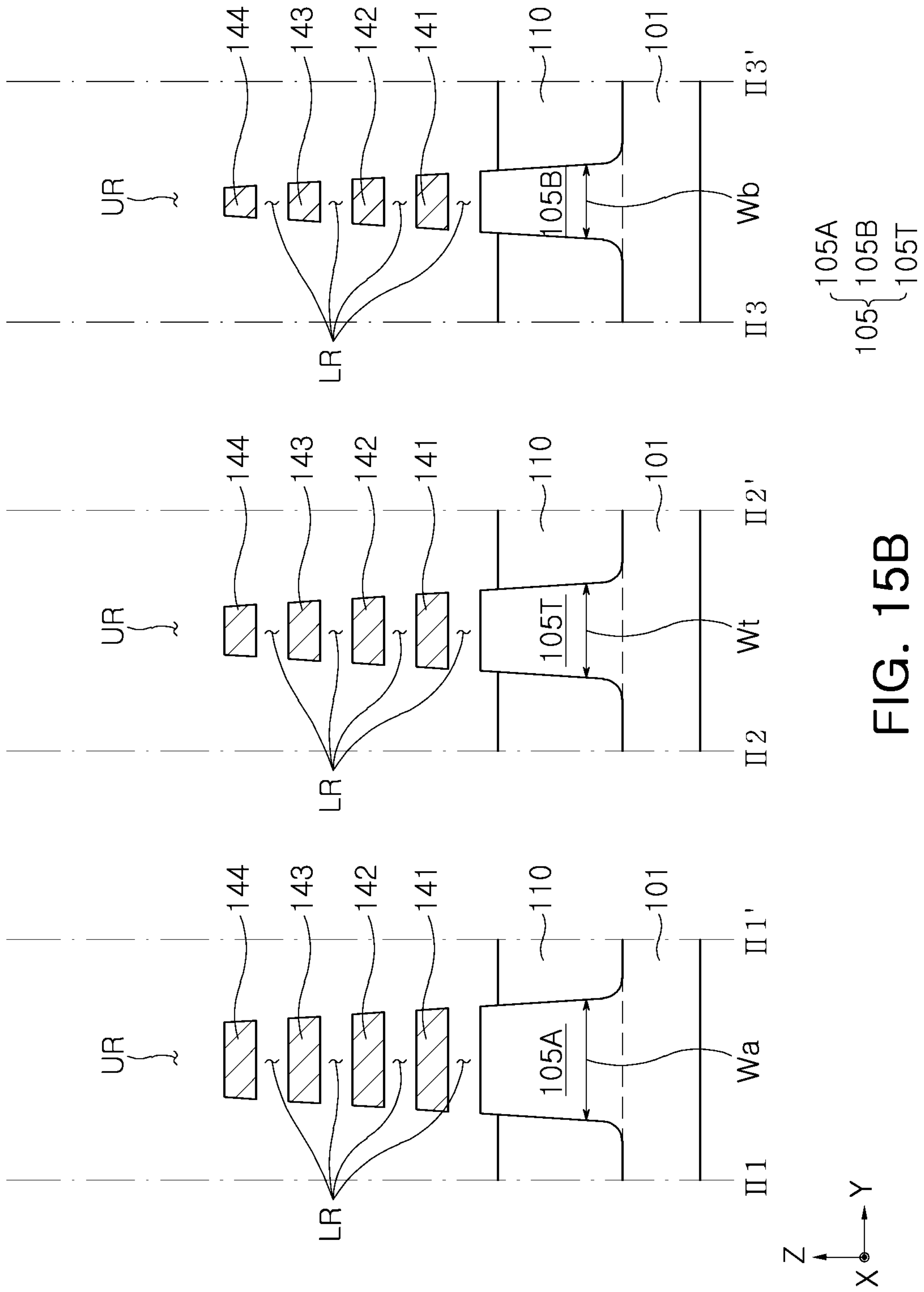
Figure 15C:
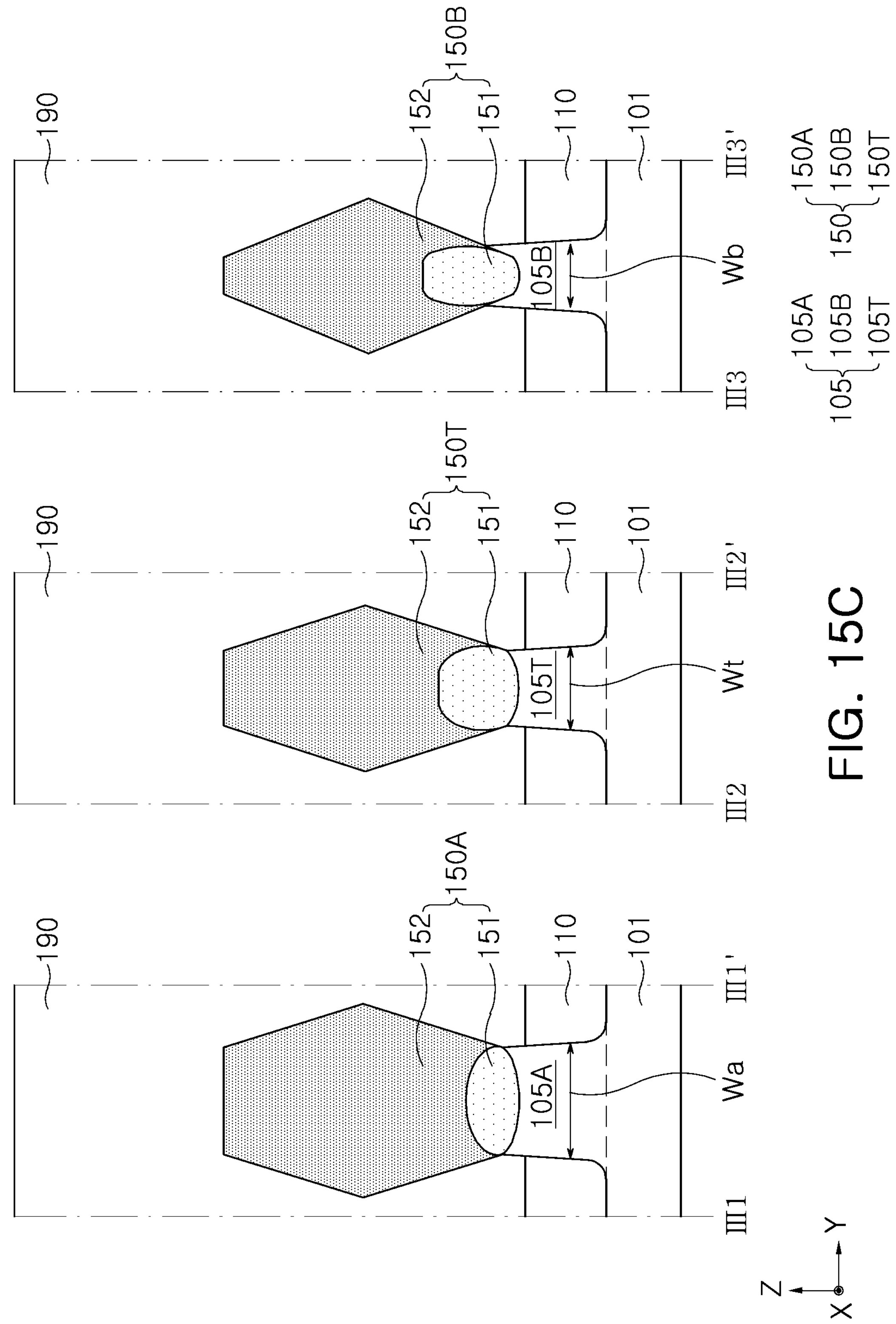

Referring to FIGS. 15A to 15C, an interlayer insulating layer 190 may be formed between adjacent sacrificial gate structures 170 on the second epitaxial layer 152, and the sacrificial layers 120 and the sacrificial gate structure 170 may be removed.

The interlayer insulating layer 190 may be formed by forming an insulating film covering the sacrificial gate structures 170 and the source/drain region 150 and performing a planarization process.

The sacrificial layers 120 and the sacrificial gate structures 170 may be selectively removed with respect to the gate spacer layers 164, the interlayer insulating layer 190, and the first to fourth channel layers 141, 142, 143, and 144. First, the upper gap regions UR may be formed by removing the sacrificial gate structures 170, and the lower gap regions LR may be formed by removing the sacrificial layers 120 exposed through the upper gap regions UR. For example, when the sacrificial layers 120 include silicon germanium (SiGe) and the first to fourth channel layers 141, 142, 143, and 144 include silicon (Si), the sacrificial layers 120 may be selectively removed with respect to the first to fourth channel layers 141, 142, 143, and 144 by performing a wet etching process using peracetic acid as an etchant.

Figure 16:
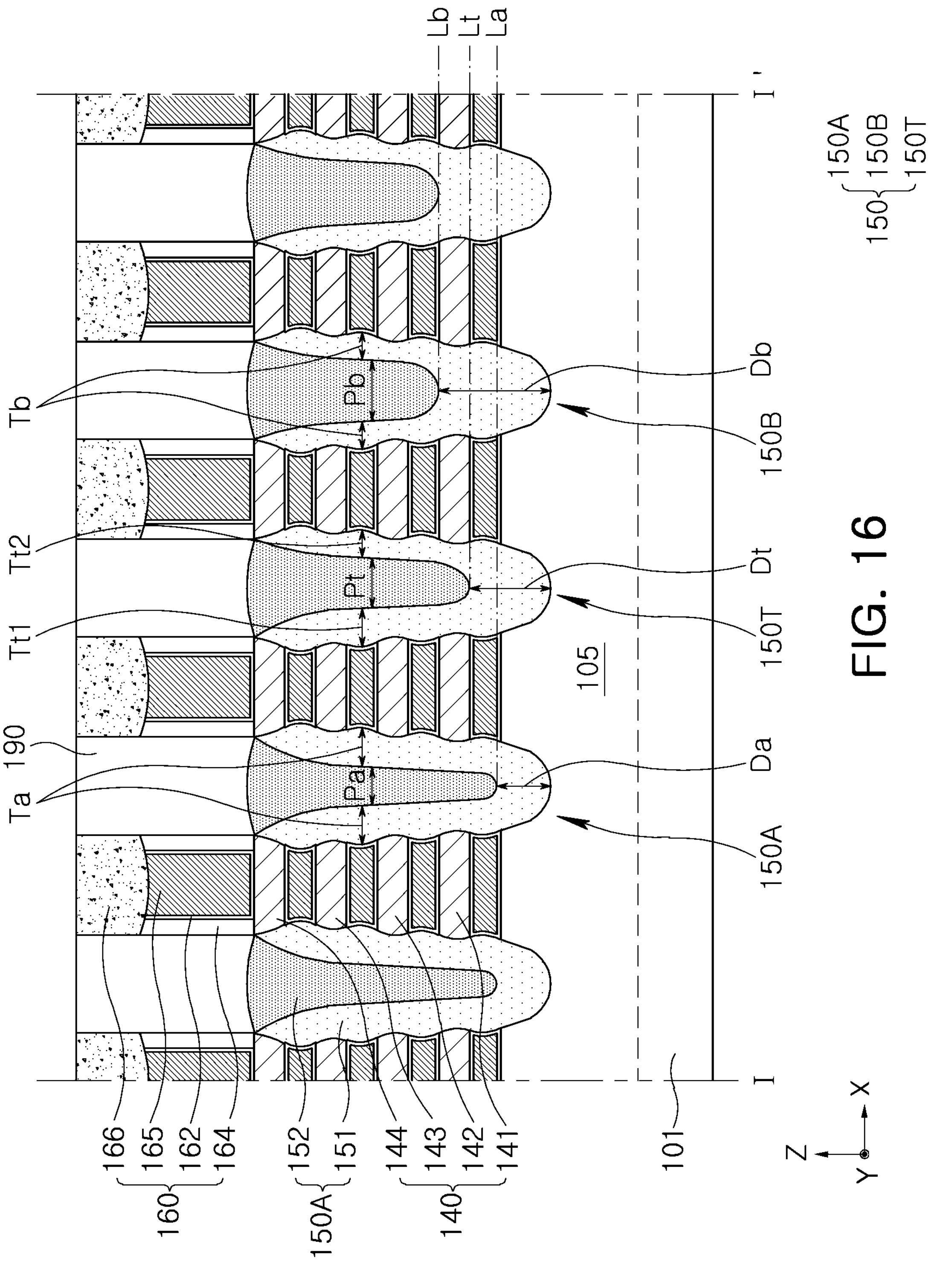

Referring to FIG. 16, the gate structures 160 may be formed in the upper gap regions UR and the lower gap regions LR.

The gate dielectric layer 162 may be formed to conformally cover the internal surfaces of the upper gap regions UR and the lower gap regions LR. The gate electrode 165 may be formed to completely fill the upper gap regions UR and the lower gap regions LR. The gate electrode 165 and the gate spacer layers 164 may be removed from the upper gap regions UR to a predetermined depth downwardly. In the upper gap regions UR, the gate capping layer 166 may be formed in the region from which the gate electrode 165 and the gate spacer layers 164 are removed. Accordingly, the gate structures 160 including the gate dielectric layer 162, the gate electrode 165, the gate spacer layers 164, and the gate capping layer 166 may be formed.

Thereafter, referring to FIGS. 2A to 2C together, contact plugs 180 may be formed.

The contact holes exposing the source/drain regions 150 may be formed by patterning the interlayer insulating layer 190. Thereafter, the contact plugs 180 may be formed by filling the contact holes with a conductive material.

Specifically, after depositing a material forming a barrier layer in the contact holes, a metal-semiconductor compound layer as a silicide layer may be formed on the lower end by performing the silicide process. Thereafter, the contact plugs 180 may be formed by depositing a conductive material to fill the contact holes. Accordingly, the semiconductor device 100 in FIGS. 1 to 2C may be manufactured.

According to the aforementioned example embodiments, by disposing the transition source/drain region on the transition active pattern connecting the first active pattern to the second active pattern with different widths, and using the structure in which the sidewalls of the first epitaxial layer of the transition source/drain region have different thicknesses and the symmetrical structure of the active region, contact between the second epitaxial layer and the gate structures may be prevented, such that a semiconductor device having improved electrical properties and reliability may be provided.

While the example embodiments have been illustrated and described above, it will be configured as apparent to those skilled in the art that modifications and variations could be made without departing from the scope of the present disclosure as defined by the appended claims.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper," "top," "bottom," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

What is claimed is:

1. A semiconductor device, comprising:

a substrate;

an active region including:

a first active pattern extending in a first, horizontal, direction on the substrate and, at a first height above a bottom surface of the substrate in a third, vertical, direction, having a first width in a second, horizontal, direction perpendicular to the first direction, a second active pattern extending in the first direction and, at the first height, having a second width in the second direction smaller than the first width, and a transition active pattern extending in the first direction and connecting the first active pattern to the second active pattern;

gate structures intersecting the active region and extending in the second direction on the substrate;

a plurality of sets of channel layers, each set including channel layers extending in the first direction, disposed in consecutive order from the active region, and spaced apart from each other in the third direction, which is perpendicular to an upper surface of the substrate, and each set surrounded by a respective gate structure on the active region; and source/drain regions disposed on sides of the gate structures, and including a first source/drain region disposed on the first active pattern, a second source/drain region disposed on the second active pattern, and a transition source/drain region disposed on the transition active pattern, wherein the active region is symmetrical in the second direction with respect to a central axis of the active region extending in the first direction, wherein each of the source/drain regions is disposed on the active region and includes a first epitaxial layer disposed on a first set of the plurality of sets of channel layers and a second set of the plurality of sets of channel layers, and a second epitaxial layer disposed on the first epitaxial layer, wherein at a second height above the bottom surface of the substrate in the third direction, a first sidewall thickness of the first epitaxial layer of the first source/drain region in the first direction is greater than a second sidewall thickness of the first epitaxial layer of the second source/drain region in the first direction, and wherein at the second height, the first epitaxial layer of the transition source/drain region has a first transition sidewall having a first transition sidewall thickness in the first direction and a second transition sidewall having a second transition sidewall thickness in the first direction, smaller than the first transition sidewall thickness.

2. The semiconductor device of claim 1, wherein at the second height, the first sidewall thickness is the same as the first transition sidewall thickness, and wherein at the second height, the second sidewall thickness is the same as the second transition sidewall thickness.

3. The semiconductor device of claim 1, wherein a thickness, in the third direction, from a lowermost end of the first epitaxial layer of the transition source/drain region to a lowermost end of the second epitaxial layer of the transition source/drain region is greater than a thickness, in the third direction, from a lowermost end of the first epitaxial layer of the first source/drain region to a lowermost end of the second epitaxial layer of the first source/drain region, and is smaller than a thickness, in the third direction, from a lowermost end of the first epitaxial layer of the second source/drain region to a lowermost end of the second epitaxial layer of the second source/drain region.

4. The semiconductor device of claim 1, wherein a vertical level of a lowermost end of the second epitaxial layer of the transition source/drain region is higher than a vertical level of a lowermost end of the second epitaxial layer of the first source/drain region, and is lower than a vertical level of a lowermost end of the second epitaxial layer of the second source/drain region.

5. The semiconductor device of claim 1, wherein the second epitaxial layer of the transition source/drain region is spaced apart from gate electrodes and gate dielectric layers of the gate structures.

6. The semiconductor device of claim 1, wherein at the first height, each of the first active pattern and the second active pattern has a constant width in the second direction, and wherein at the first height, a width of the transition active pattern in the second direction gradually increases or decreases along the first direction.

7. The semiconductor device of claim 1, wherein at the second height, a width of the second epitaxial layer of the transition source/drain region in the first direction is greater than a width of the second epitaxial layer of the first source/drain region in the first direction, and is smaller than a width of the second epitaxial layer of the second source/drain region in the first direction.

8. The semiconductor device of claim 1, wherein an external side surface of at least a portion of the first epitaxial layer and the second epitaxial layer is a facet along a crystal plane, on a plan diagram.

9. The semiconductor device of claim 1, further comprising:

For each source/drain region, a contact plug recessed into the source/drain region and connected to the source/drain region.

10. The semiconductor device of claim 1, further comprising:

internal spacer layers disposed on opposite sides of each of the gate structures in the first direction.

11. The semiconductor device of claim 1, wherein each set of the plurality sets of channel layers disposed on the first active pattern includes consecutively ordered channel layers having a first set of widths in the second direction, wherein each set of the plurality sets of channel layers disposed on the second active pattern includes consecutively ordered channel layers having a second set of widths in the second direction, each width of the second set of widths smaller than a respective width of the first set of widths, and wherein each set of the plurality sets of channel layers disposed on the transition active pattern includes consecutively ordered channel layers having a third set of widths in the second direction, each width of the third set of widths smaller than a respective width of the first set of widths and greater than a respective width of the second set of widths.

12. The semiconductor device of claim 11, wherein at the first height, each of the first active pattern and the second active pattern has a constant width in the second direction, and wherein at the first height, a width in the second direction of the transition active pattern gradually increases or decreases along the first direction.

13. A semiconductor device, comprising:

a substrate;

an active region extending in a first, horizontal, direction on the substrate, and including a first active pattern at a first height above a bottom surface of the substrate in a vertical direction and having a first width in a second, horizontal, direction, a second active pattern having a second width in the second direction different from the first width, and a transition active pattern connecting the first active pattern to the second active pattern;

gate structures intersecting the active region, each gate structure extending in the second direction across the substrate; and source/drain regions disposed on sides of the gate structures, and including a first source/drain region disposed on the first active pattern, a second source/drain region disposed on the second active pattern, and a transition source/drain region disposed on the transition active pattern, wherein each of the source/drain regions is disposed on the active region and includes a first epitaxial layer having a recessed upper surface and a second epitaxial layer disposed on the first epitaxial layer, wherein at a second height above a bottom surface of the substrate in a vertical direction, a first sidewall thickness of the first epitaxial layer of the first source/drain region in the first direction is different from a second sidewall thickness of the first epitaxial layer of the second source/drain region in the first direction, wherein at the second height, thicknesses of opposing sidewalls of the first epitaxial layer of the transition source/drain region in the first direction are different, and wherein a vertical level of a lowermost end of the second epitaxial layer of the first source/drain region, a vertical level of a lowermost end of the second epitaxial layer of the second source/drain region, and a vertical level of a lowermost end of the second epitaxial layer of the transition source/drain region are different from each other.

14. The semiconductor device of claim 13, wherein at the first height, a width of the transition active pattern in the second direction gradually decreases or increases along the first direction.

15. The semiconductor device of claim 13, wherein the active region further includes a third active pattern having a third width different from the first width and the second width, wherein the source/drain regions further include a third source/drain region on the third active pattern, wherein an additional transition active pattern connects the second active pattern to the third active pattern, and wherein at the second height, a third sidewall thickness of the first epitaxial layer of the third source/drain region in the first direction is different from the first sidewall thickness and the second sidewall thickness.

16. The semiconductor device of claim 15, wherein the first width is greater than the second width, wherein the second width is greater than the third width, wherein the first sidewall thickness is greater than the second sidewall thickness, and wherein the second sidewall thickness is greater than the third sidewall thickness.

17. The semiconductor device of claim 15, wherein the first width is greater than the second width and the third width, wherein the third width is greater than the second width, wherein the first sidewall thickness is greater than the second sidewall thickness and the third sidewall thickness, and wherein the third sidewall thickness is greater than the second sidewall thickness.

18. The semiconductor device of claim 13, wherein the first active pattern is symmetrical in the second direction with respect to a central axis of the first active pattern extending in the first direction, wherein the second active pattern is symmetrical in the second direction with respect to a central axis of the second active pattern extending in the first direction, and wherein a central axis of the first active pattern and a central axis of the second active pattern are shifted from each other.

19. A semiconductor device, comprising:

a substrate;

an active region extending in a first direction on the substrate, and including a first active pattern having a first width in a second direction crossing the first direction, a second active pattern having a second width in the second direction smaller than the first width, and a transition active pattern connecting the first active pattern to the second active pattern, gate structures intersecting the active region on the substrate and extending in the second direction;

a plurality of sets of channel layers, each set including channel layers extending in the first direction, disposed in consecutive order from the active region, and spaced apart from each other in a third direction perpendicular to an upper surface of the substrate, and each set surrounded by a respective gate structure on the active region, the plurality of sets of channel layers arranged apart from each other in the first direction; and source/drain regions disposed between gate structures adjacent each other in the first direction, and including a first source/drain region disposed on the first active pattern, a second source/drain region disposed on the second active pattern, and a transition source/drain region disposed on the transition active pattern, wherein each of the source/drain regions is disposed on the active region and includes a first epitaxial layer disposed between adjacent sets of the plurality of channel layers and a second epitaxial layer disposed on the first epitaxial layer, wherein at a first vertical height above a bottom surface of the substrate, the transition source/drain region has a first transition sidewall thickness, in the first direction, of the first epitaxial layer of the transition source/drain region and a second transition sidewall thickness in the first direction, smaller than the first transition sidewall thickness, and wherein a vertical level of a lowermost end of the second epitaxial layer of the transition source/drain region is higher than a vertical level of a lowermost end of the second epitaxial layer of the first source/drain region and is lower than a vertical level of a lowermost end of the second epitaxial layer of the second source/drain region.

20. The semiconductor device of claim 19, wherein at a second vertical height above the bottom surface of the substrate, a width of the transition active pattern in the second direction gradually decreases or increases along the first direction, wherein each set of channel layers disposed on the transition active pattern includes consecutively ordered channel layers having a set of widths in the second direction.

* * * * *